(12) United States Patent
Ono et al.

(10) Patent No.: US 8,729,557 B2
(45) Date of Patent: May 20, 2014

(54) ELECTROLUMINESCENCE DISPLAY DEVICE

(71) Applicant: Semiconductor Energy Laboratory Co., Ltd., Atsugi (JP)

(72) Inventors: Koji Ono, Atsugi (JP); Hideomi Suzawa, Atsugi (JP); Tatsuya Arao, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/027,871

(22) Filed: Sep. 16, 2013

(65) Prior Publication Data

US 2014/0014996 A1    Jan. 16, 2014

Related U.S. Application Data

(60) Continuation of application No. 13/185,989, filed on Jul. 19, 2011, now Pat. No. 8,569,767, which is a continuation of application No. 12/501,801, filed on Jul. 13, 2009, now Pat. No. 8,120,039, which is a continuation of application No. 11/305,212, filed on Dec. 19, 2005, now Pat. No. 7,560,734, which is a division of application No. 10/645,516, filed on Aug. 22, 2003, now Pat. No. 7,008,828, which is a division of application No. 09/714,891, filed on Nov. 17, 2000, now Pat. No. 6,646,287.

(30) Foreign Application Priority Data

Nov. 19, 1999  (JP) .................................. 11-330174

(51) Int. Cl.
H01L 27/14         (2006.01)

(52) U.S. Cl.
USPC   257/72; 257/59; 257/E29.137; 257/E29.278; 349/153; 349/155

(58) Field of Classification Search
CPC ...................... H01L 27/1214; H01L 29/42384
USPC .............. 257/59, 72, 344, 347, 408, E29.137, 257/E29.278; 349/153, 155
See application file for complete search history.

(56) References Cited

U.S. PATENT DOCUMENTS 4,357,557 A   11/1982  Inohara et al.
4,394,182 A    7/1983  Maddox, III
(Continued)

FOREIGN PATENT DOCUMENTS

EP   0 493 113 A    7/1992
EP   0 519 692 A   12/1992
(Continued)

OTHER PUBLICATIONS

Shimokawa et al., "Characterization of High-Efficiency Cast-Si Solar Cell Wafers by MBIC Measurement," Japanese Journal of Applied Physics, vol. 27, No. 5, May 1988, pp. 751-758.

(Continued)

Primary Examiner — Kenneth Parker
Assistant Examiner — Jose R Diaz
(74) Attorney, Agent, or Firm — Eric J. Robinson; Robinson Intellectual Property Law Office, P.C.

(57) ABSTRACT

Disclosed is an electroluminescence device having a substrate, a thin film transistor over the substrate, an insulating film over the thin film transistor, an electroluminescence element over the insulating film, a passivation film over the electroluminescence element, and a counter substrate over the passivation film. The electroluminescence element is configured to emit light through the counter substrate, and a space between the substrate and the counter substrate is filled with a filler. The electroluminescence device is featured by the tapered side surface of a gate electrode of the thin film transistor.

21 Claims, 30 Drawing Sheets

(56) References Cited

U.S. PATENT DOCUMENTS

| | | | |
|---|---|---|---|
| 4,658,496 A | 4/1987 | Beinvogl et al. |
| 4,753,896 A | 6/1988 | Matloubian |
| 5,028,564 A | 7/1991 | Chang et al. |
| 5,072,263 A | 12/1991 | Watanabe et al. |
| 5,100,820 A | 3/1992 | Tsubone |
| 5,107,175 A | 4/1992 | Hirano et al. |
| 5,124,204 A | 6/1992 | Yamashita et al. |
| 5,189,405 A | 2/1993 | Yamashita et al. |
| 5,247,190 A | 9/1993 | Friend et al. |
| 5,286,659 A | 2/1994 | Mitani et al. |
| 5,292,675 A | 3/1994 | Codama |
| 5,323,042 A | 6/1994 | Matsumoto |
| 5,393,682 A | 2/1995 | Liu |
| 5,399,502 A | 3/1995 | Friend et al. |
| 5,401,982 A | 3/1995 | King et al. |
| 5,405,791 A | 4/1995 | Ahmad et al. |
| 5,474,941 A | 12/1995 | Mitani et al. |
| 5,518,940 A | 5/1996 | Hodate et al. |
| 5,528,397 A | 6/1996 | Zavracky et al. |
| 5,576,556 A | 11/1996 | Takemura et al. |
| 5,583,369 A | 12/1996 | Yamazaki et al. |
| 5,593,907 A | 1/1997 | Anjum et al. |
| 5,612,234 A | 3/1997 | Ha |
| 5,620,905 A | 4/1997 | Konuma et al. |
| 5,643,826 A | 7/1997 | Ohtani et al. |
| 5,686,328 A | 11/1997 | Zhang et al. |
| 5,686,360 A | 11/1997 | Harvey et al. |
| 5,693,956 A | 12/1997 | Shi et al. |
| 5,705,424 A | 1/1998 | Zavracky et al. |
| 5,710,606 A | 1/1998 | Nakajima et al. |
| 5,719,065 A | 2/1998 | Takemura et al. |
| 5,729,308 A | 3/1998 | Yamazaki et al. |
| 5,736,414 A | 4/1998 | Yamaguchi |
| 5,736,750 A | 4/1998 | Yamazaki et al. |
| 5,757,126 A | 5/1998 | Harvey et al. |
| 5,771,562 A | 6/1998 | Harvey et al. |
| 5,786,620 A | 7/1998 | Richards et al. |
| 5,789,762 A | 8/1998 | Koyama et al. |
| 5,801,416 A | 9/1998 | Choi et al. |
| 5,811,177 A | 9/1998 | Shi et al. |
| 5,827,747 A | 10/1998 | Wang et al. |
| 5,830,787 A | 11/1998 | Kim |
| 5,869,929 A | 2/1999 | Eida et al. |
| 5,882,761 A | 3/1999 | Kawami et al. |
| 5,923,962 A | 7/1999 | Ohtani et al. |
| 5,926,735 A | 7/1999 | Yamazaki et al. |
| 5,929,483 A | 7/1999 | Kim et al. |
| 5,949,107 A | 9/1999 | Zhang |
| 5,952,778 A | 9/1999 | Haskal et al. |
| 5,956,588 A | 9/1999 | Choi et al. |
| 5,959,313 A | 9/1999 | Yamazaki et al. |
| 5,962,962 A | 10/1999 | Fujita et al. |
| 5,966,193 A | 10/1999 | Zhang et al. |
| 5,973,258 A | 10/1999 | Shiotsuka et al. |
| 5,990,542 A | 11/1999 | Yamazaki |
| 5,998,805 A | 12/1999 | Shi et al. |
| 6,001,714 A | 12/1999 | Nakajima et al. |
| 6,030,667 A | 2/2000 | Nakagawa et al. |
| 6,051,883 A | 4/2000 | Nakamura |
| 6,114,183 A | 9/2000 | Hamada et al. |
| 6,114,715 A | 9/2000 | Hamada |
| 6,115,088 A | 9/2000 | Zhang et al. |
| 6,146,225 A | 11/2000 | Sheats et al. |
| 6,149,757 A | 11/2000 | Chikaki et al. |
| 6,150,187 A | 11/2000 | Zyung et al. |
| 6,165,824 A | 12/2000 | Takano et al. |
| 6,166,414 A | 12/2000 | Miyazaki et al. |
| 6,198,133 B1 | 3/2001 | Yamazaki et al. |
| 6,198,217 B1 | 3/2001 | Suzuki et al. |
| 6,198,220 B1 | 3/2001 | Jones et al. |
| 6,200,836 B1 | 3/2001 | Yoo |
| 6,207,519 B1 | 3/2001 | Kim et al. |
| 6,215,155 B1 | 4/2001 | Wollesen |
| 6,239,470 B1 | 5/2001 | Yamazaki |
| 6,268,071 B1 | 7/2001 | Yasukawa et al. |
| 6,268,695 B1 | 7/2001 | Affinito |
| 6,274,887 B1 | 8/2001 | Yamazaki et al. |
| 6,280,559 B1 | 8/2001 | Terada et al. |
| 6,281,552 B1 | 8/2001 | Kawasaki et al. |
| 6,287,898 B1 | 9/2001 | Sera |
| 6,288,764 B1 | 9/2001 | Zhang et al. |
| 6,320,115 B1 | 11/2001 | Kataoka et al. |
| 6,323,416 B1 | 11/2001 | Komori et al. |
| 6,330,044 B1 | 12/2001 | Murade |
| 6,333,603 B1 | 12/2001 | Juang et al. |
| 6,335,290 B1 | 1/2002 | Ishida |
| 6,348,382 B1 | 2/2002 | Su et al. |
| 6,365,917 B1 | 4/2002 | Yamazaki |
| 6,380,558 B1 | 4/2002 | Yamazaki et al. |
| 6,404,479 B2 | 6/2002 | Zhang et al. |
| 6,413,645 B1 | 7/2002 | Graff et al. |
| 6,417,896 B1 | 7/2002 | Yamazaki et al. |
| 6,420,200 B1 | 7/2002 | Yamazaki et al. |
| 6,421,101 B1 | 7/2002 | Zhang et al. |
| 6,432,561 B1 | 8/2002 | Yamazaki |
| 6,433,487 B1 | 8/2002 | Yamazaki |
| 6,440,877 B1 | 8/2002 | Yamazaki et al. |
| 6,441,468 B1 | 8/2002 | Yamazaki |
| 6,447,867 B1 | 9/2002 | Kominami et al. |
| 6,469,317 B1 | 10/2002 | Yamazaki et al. |
| 6,479,333 B1 | 11/2002 | Takano et al. |
| 6,490,014 B1 | 12/2002 | Ohtani et al. |
| 6,501,098 B2 | 12/2002 | Yamazaki |
| 6,524,895 B2 | 2/2003 | Yamazaki et al. |
| 6,534,789 B2 | 3/2003 | Ishida |
| 6,534,826 B2 | 3/2003 | Yamazaki |
| 6,541,294 B1 | 4/2003 | Yamazaki |
| 6,555,969 B2 | 4/2003 | Yamazaki |
| 6,577,372 B2 | 6/2003 | Zhang et al. |
| 6,605,826 B2 | 8/2003 | Yamazaki et al. |
| 6,617,644 B1 | 9/2003 | Yamazaki et al. |
| 6,645,826 B2 | 11/2003 | Yamazaki et al. |
| 6,664,145 B1 | 12/2003 | Yamazaki |
| 6,770,502 B2 | 8/2004 | Cok et al. |
| 6,893,503 B1 | 5/2005 | Ohnuma et al. |
| 6,909,114 B1 | 6/2005 | Yamazaki |
| 6,914,642 B2 | 7/2005 | Yamazaki et al. |
| 6,972,435 B2 | 12/2005 | Ohtani |
| 6,977,394 B2 | 12/2005 | Yamazaki et al. |
| 7,023,502 B2 | 4/2006 | Zhang et al. |
| 7,046,313 B2 | 5/2006 | Zhang et al. |
| 7,215,402 B2 | 5/2007 | Zhang et al. |
| 7,222,981 B2 | 5/2007 | Yamazaki et al. |
| 7,301,209 B2 | 11/2007 | Takemura et al. |
| 7,333,160 B2 | 2/2008 | Zhang et al. |
| 7,414,288 B2 | 8/2008 | Ohtani |
| 7,474,376 B2 | 1/2009 | Zhang et al. |
| 7,483,089 B2 | 1/2009 | Ohtani et al. |
| 7,518,146 B2 | 4/2009 | Yamazaki et al. |
| 7,560,734 B2 | 7/2009 | Ono et al. |
| 7,646,022 B2 | 1/2010 | Zhang et al. |
| 7,952,103 B2 | 5/2011 | Yamazaki et al. |
| 8,053,979 B2 | 11/2011 | Yamazaki et al. |
| 2002/0125817 A1 | 9/2002 | Yamazaki et al. |
| 2006/0113597 A1 | 6/2006 | Ono et al. |
| 2009/0072235 A1 | 3/2009 | Zhang et al. |

FOREIGN PATENT DOCUMENTS

| | | |
|---|---|---|
| EP | 1 003 223 | 5/2000 |
| EP | 1 049 167 | 11/2000 |
| JP | 04-369271 | 12/1992 |
| JP | 05-055573 A | 3/1993 |
| JP | 05-102483 | 4/1993 |
| JP | 6-148685 | 5/1994 |
| JP | 06-333948 A | 12/1994 |
| JP | 07-130652 | 5/1995 |
| JP | 7-235680 | 9/1995 |
| JP | 08-068990 A | 3/1996 |
| JP | 08-078329 | 3/1996 |
| JP | 08-096959 A | 4/1996 |
| JP | 8-274336 | 10/1996 |
| JP | 09-148066 A | 6/1997 |
| JP | 09-191111 | 7/1997 |

(56) References Cited

FOREIGN PATENT DOCUMENTS

| JP | 09-293600 | 11/1997 |
| JP | 10-010544 A | 1/1998 |
| JP | 10-092576 | 4/1998 |
| JP | 10-104659 | 4/1998 |
| JP | 10-125928 A | 5/1998 |
| JP | 10-135468 | 5/1998 |
| JP | 10-135469 | 5/1998 |
| JP | 10-233511 | 9/1998 |
| JP | 10-247735 A | 9/1998 |
| JP | 10-270363 A | 10/1998 |
| JP | 10-294280 | 11/1998 |
| JP | 11-191628 | 7/1999 |
| JP | 11-345767 | 12/1999 |
| JP | 11-354442 | 12/1999 |
| JP | 2000-047263 A | 2/2000 |
| WO | 90/13148 | 11/1990 |

OTHER PUBLICATIONS

Hatano et al., "A Novel Self-Aligned Gate-Overlapped LDD Poly-Si TFT With High Reliability and Performance," IEDM Technical Digest 97, pp. 523-526.

Schenk et al., "Polymers for Light Emitting Diodes," EuroDisplay '99 Proceedings, pp. 33-37.

Search Report (Application No. 99121683.9) dated May 9, 2000.

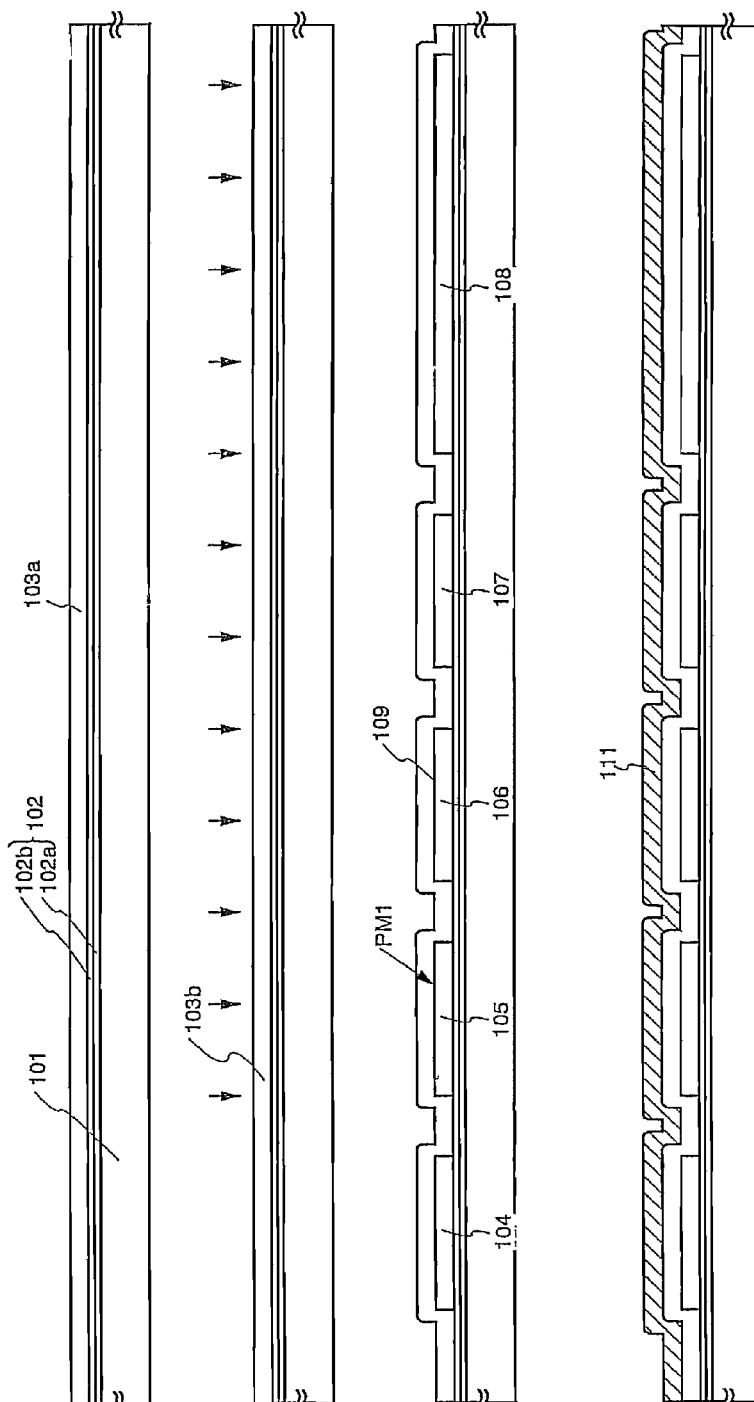

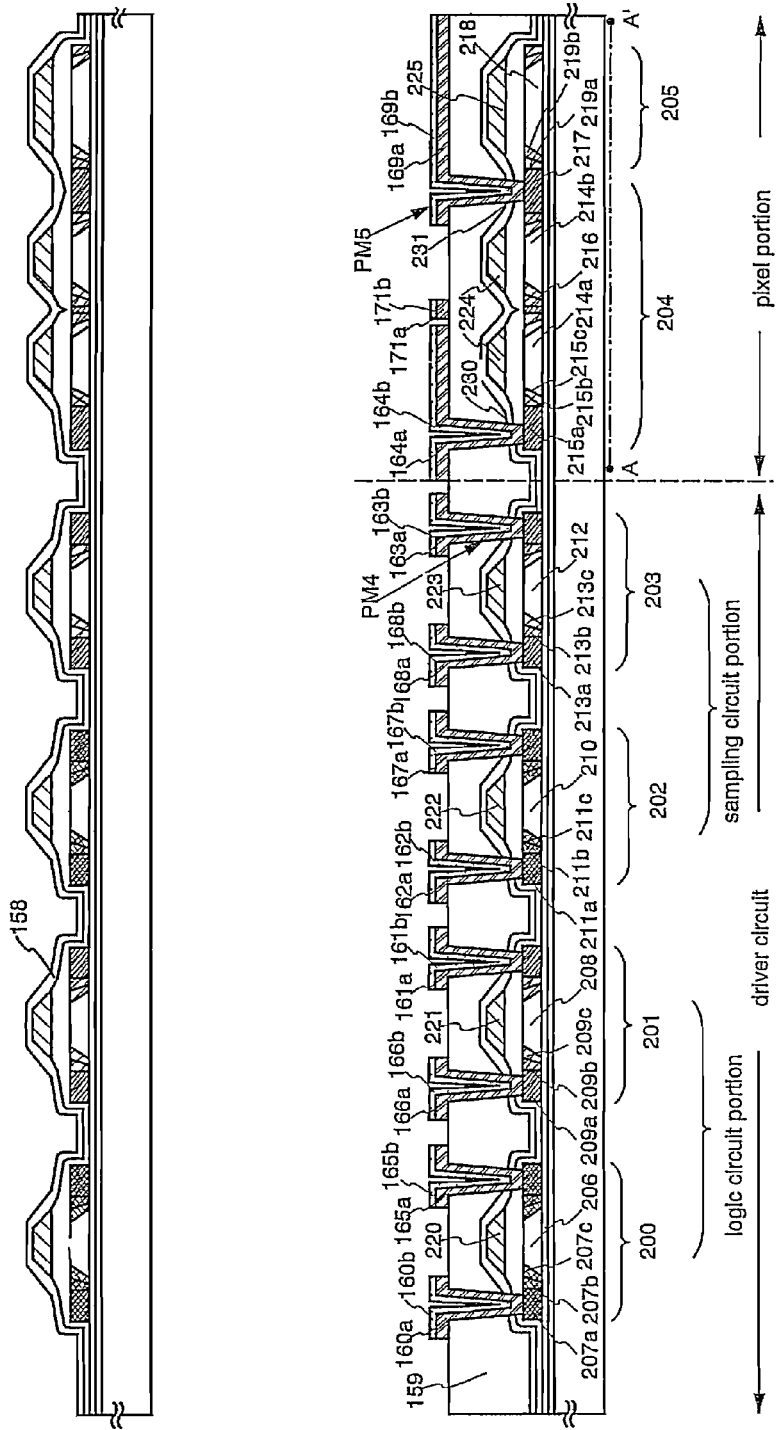

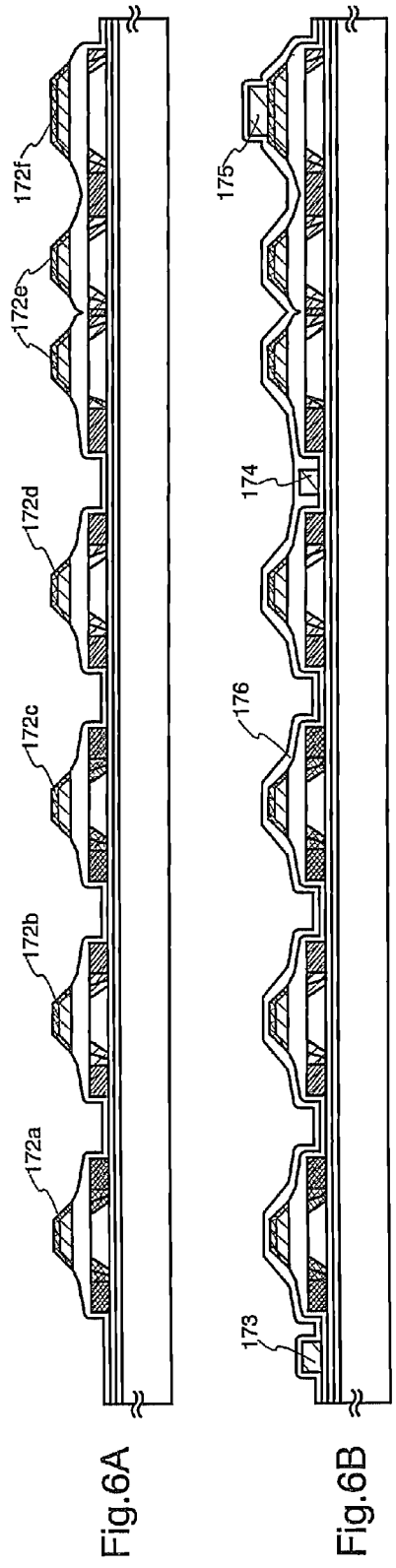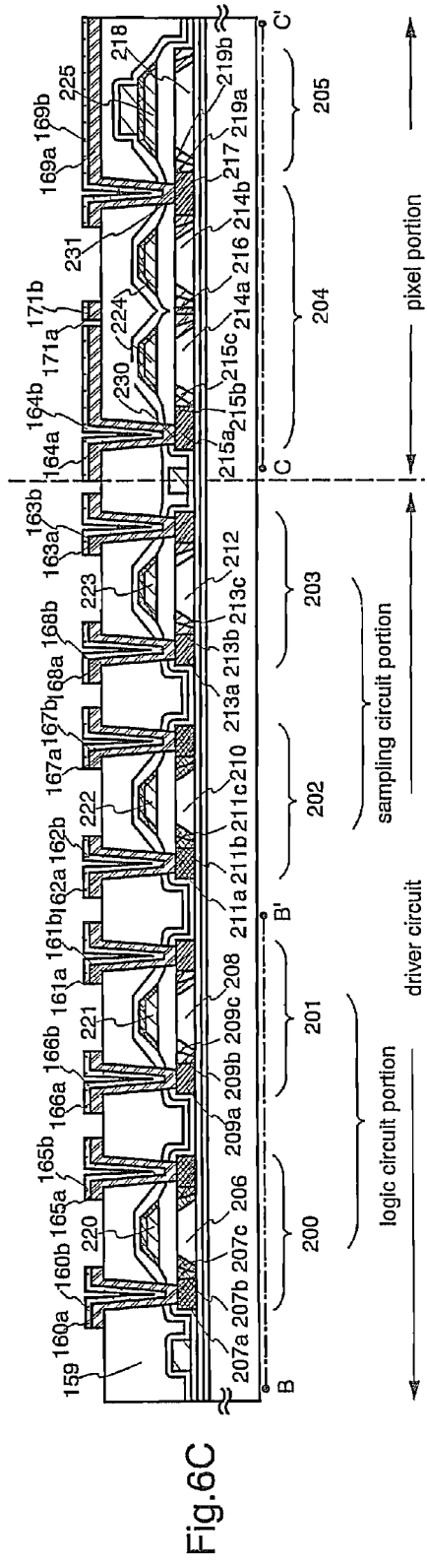

logic circuit portion sampling circuit portion

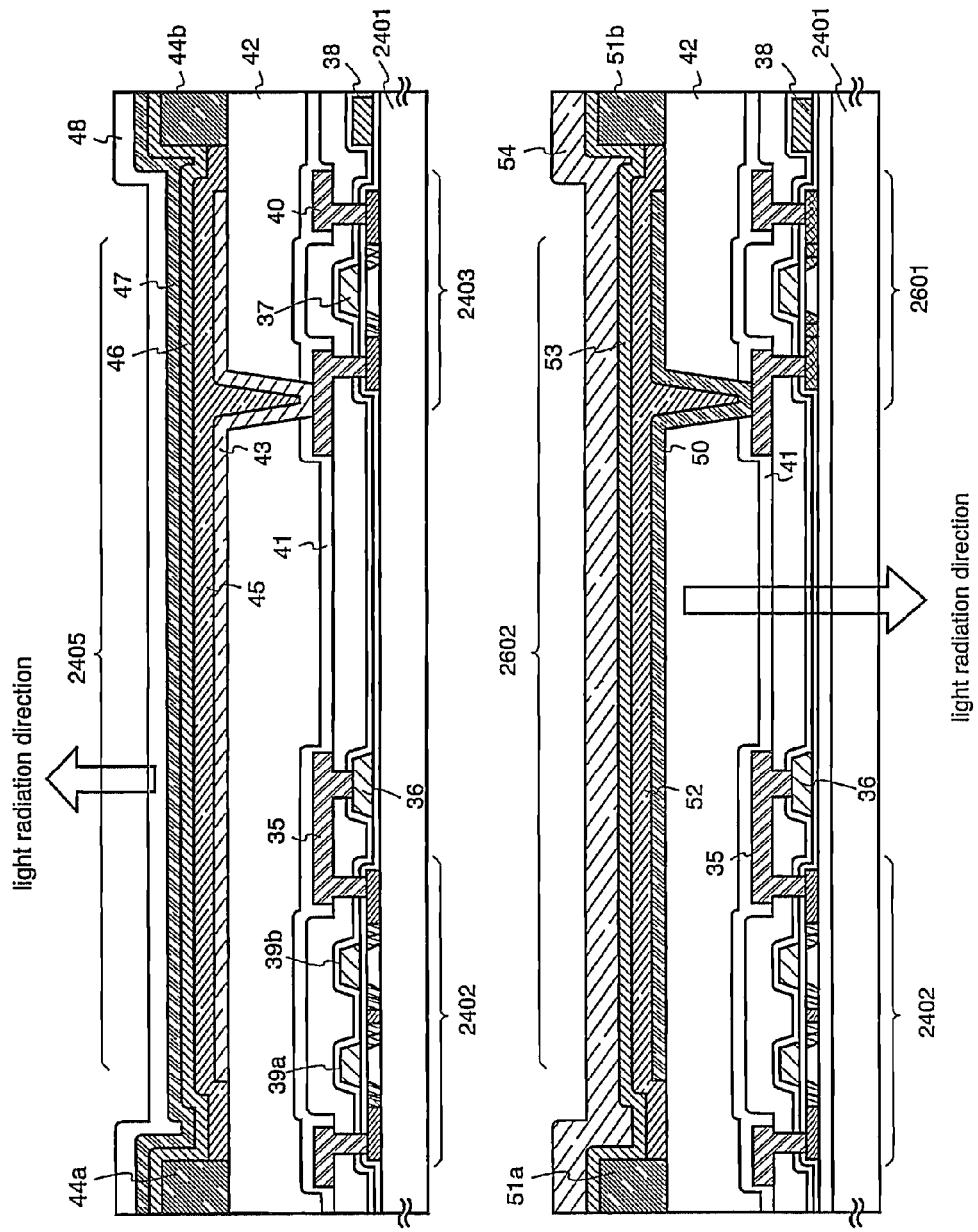

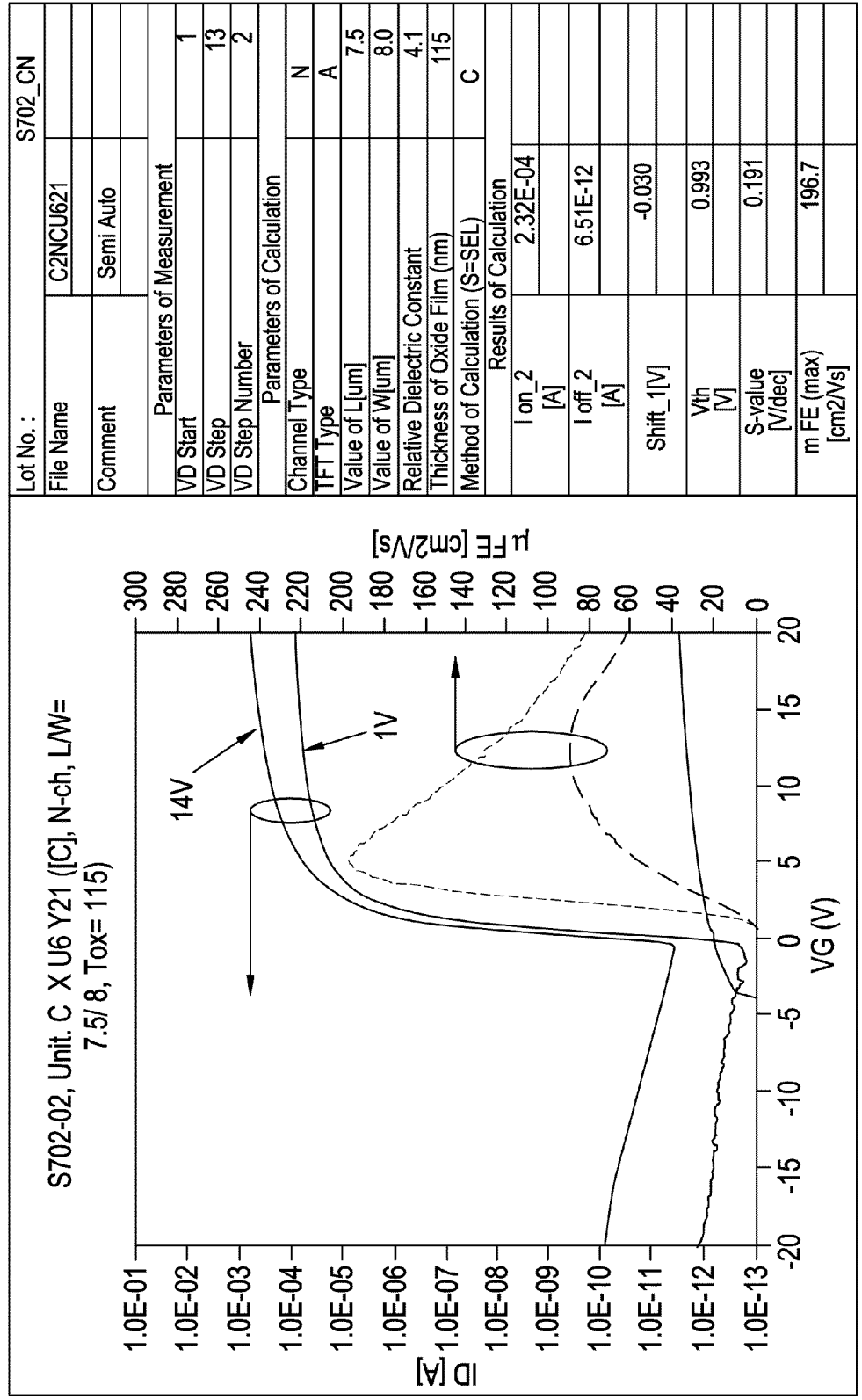

ELECTROLUMINESCENCE DISPLAY DEVICE

BACKGROUND OF THE INVENTION

1. Field of the Invention

The present invention relates to a semiconductor device having a circuit structured by a thin film transistor (hereafter referred to as a TFT) on a substrate having an insulating surface, and to a method of manufacture thereof. In particular, the present invention provides an electro-optical device, typically a liquid crystal display device or an EL display device in which a pixel portion and a driver circuit are formed on the same substrate, and provides a technique of suitably utilizing this type of electro-optical device loaded into electronic equipment. Note that, throughout this specification, the term semiconductor device indicates a general device functioning by utilizing semiconductor characteristics, and the above electro-optical device, and equipment in which the electro-optical device is loaded, are included in the category of semiconductor device.

2. Description of the Related Art

A display device structured by a pixel portion in which active elements are arranged is referred to as an active matrix display device, and devices such as a liquid crystal display device and an electroluminescence (hereafter referred to as EL) display device have been developed. An insulating gate type transistor is used in an active element, and a TFT is used ideally. A semiconductor film is formed on a substrate such as glass by a method such as a vapor phase growth method, and, using the semiconductor film, regions such as a channel forming region, a source region, and a drain regions are formed for the TFT. Ideally a material having silicon as its main constituent, such as silicon or silicon germanium, is used in the semiconductor film. Semiconductor films can be classified into amorphous semiconductor films, typically amorphous silicon, and into crystalline semiconductor films, typically polycrystalline silicon, in accordance with their method of manufacture. In addition, techniques for structuring a pixel portion by insulating gate type transistors formed on a single crystal silicon substrate have been developed in recent years.

It is nearly impossible to obtain an electric field effect mobility equal to or greater than 10 $cm^2/V \cdot sec$ in a TFT in which an active layer is formed by an amorphous semiconductor (typically amorphous silicon) film due to electrical solid state factors such as the amorphous crystal structure. Therefore, even though they can be used as switching elements for driving a liquid crystal in the pixel portion in an active matrix type liquid crystal display device (switching elements formed by TFTs are hereafter referred to as pixel TFTs), it is impossible to use them to form a driver circuit for performing image display. Consequently, a driver IC is implemented by using a technique such as TAB (tape automated bonding) or COG (chip on glass).

On the other hand, with a TFT having a semiconductor film, typically a crystalline silicon or a polycrystalline silicon, containing a crystalline structure (hereafter referred to as a crystalline semiconductor) as an active layer, a high electric field effect mobility can be obtained, and therefore this type of TFT can form all types of functional circuit and can perform driving. It therefore becomes possible to realize a pixel TFT and, on the same substrate, circuits such as a shift register circuit, a level shifter circuit, a buffer circuit, and a sampling circuit in a driver circuit. The driver circuit is formed by CMOS circuits, composed of n-channel TFTs and p-channel TFTs, as basic units. Techniques of implementing this type of driver circuit are fundamental, and in order to promote making lower weight and thinner liquid crystal display devices, it is thought that a TFT having a crystalline semiconductor layer as an active layer, in which it is possible to form the driver circuit, in addition to the pixel portion, on the same substrate, is suitable.

Forming the active layer by a crystalline semiconductor layer is superior when comparing TFT characteristics, but there are problems in that the manufacturing process becomes complex, and the number of process steps increases, in order to manufacture a TFT corresponding to each circuit in addition to the pixel TFT. It is clear that the increase in the number of process steps is a cause of increased manufacturing costs, and that it leads to a drop in the manufactured yield.

The operating conditions of the pixel TFTs and driver circuit TFTs are not necessarily the same, and therefore the required characteristics of the TFTs also differ greatly. A pixel TFT formed by an n-channel TFT is a switching element which drives a liquid crystal by applying a voltage. The liquid crystal is driven by an AC current therefore a method referred to as frame inversion drive is employed. The pixel TFT is required to have a sufficiently low Off current (the drain current flowing when the TFT is in off operation) in order to maintain an electric charge which has accumulated in a liquid crystal layer for the duration of one frame period. On the other hand, a high driver voltage is applied to the driver circuits, such as a buffer circuit, and therefore a high voltage resistance is required so that the circuit is not damaged due to the high voltage application. Further, in order to increase the electric current driver performance, it is necessary to secure a sufficient value of the On current (the drain current flowing when the TFT is in on operation).

An LDD (lightly doped drain) structure is known as a TFT structure for reducing the value of the Off current. This structure is one in which a region having a low concentration of an added impurity element is formed between a channel forming region and a source region or drain region having a high concentration of an added impurity element, and the low concentration region is referred to as an LDD region. Further, there is a GOLD (gate-drain overlapped LDD) structure, in which the LDD region is arranged so as to overlap a gate electrode through a gate insulating film, as a means of preventing degradation of the On current value due to a hot carrier. It is known that using this type of structure is effective in preventing deterioration phenomena by relieving the high electric field near a drain and protecting against hot carrier injection.

However, the bias state of the pixel TFT and driver circuit TFTs such as those of a shift register circuit and a buffer circuit are not necessarily the same. For example, a large inverse bias is applied to the gate in the pixel TFT (a negative voltage for an n-channel TFT), but driver circuit TFTs basically will not operate in an inverse bias state. Further, the GOLD structure is effective in protecting against degradation of the On current value, but the value of the Off current becomes large by simply overlapping with the gate electrode. On the other hand, although the Off current value control effect is high for a normal LDD structure, it has low effectiveness in relieving the electric field in the vicinity of the drain and therefore in preventing deterioration due to hot carrier injection. This type of problem becomes more tangible, the more the characteristics increase, and the higher the required functionality of the active matrix type liquid crystal display device, particularly in a crystalline silicon TFT. Therefore, considering the different TFT operating state, and considering the prevention of the above hot carrier effect, it is necessary to optimize parameters such as the impurity element concentration of the LDD region, and its distribution.

SUMMARY OF THE INVENTION

The present invention is a technique of solving the above problems, and an object of the present invention is to realize an improvement in the operating characteristics and the reliability of a semiconductor device by using appropriate structures, in accordance with circuit function, for TFTs arranged in each circuit of the semiconductor device, typically an active matrix type display device manufactured by using TFTs. In addition, an object of the present invention is to realize a reduction in manufacturing costs, and an increase in yield, by reducing the number of process steps.

In order to realize a reduction in manufacturing costs and an increase in yield, reducing the number of process steps is one means which can be applied. Specifically, it is necessary to reduce the number of photomasks required for TFT manufacture. Photomasks are used in order to form a resist pattern which serves as an etching mask in a photolithography technique, on a substrate. To use one of these photomasks, in addition to steps such as film formation and etching, there are additional steps such as those of resist peeling, cleaning, and drying, and even in the photolithography process, complex steps such as resist application, prebaking, exposure; development, and post baking are performed.

Even while reducing the number of photomasks, the structure of TFTs arranged in each type of circuit is made appropriate in correspondence with the function of the circuit. Specifically, a structure which places emphasis on reducing the value of the Off current more than on operation speed is preferable for a pixel TFT. A multi-gate structure is employed as that type of structure. On the other hand, for a TFT forming a driver circuit in which high speed operation is demanded, it is necessary to use a structure which increases the operation speed and which, at the same time, places emphasis on controlling the conspicuous problem of degradation due to hot carrier injection. This structure is realized by an LDD region of a novel configuration. To be specific, a concentration gradient of an impurity element for controlling conductivity is set in the LDD region formed between a channel forming region and the drain region such that the concentration increases as the distance from the drain region decreases. Thus, an effect can be increased in which the concentration of an electric field in a depletion layer near the drain region is relieved. A portion of the LDD region may also be formed so as to overlap a gate electrode.

In order to form an LDD region having an above-described concentration gradient of an impurity element, a method of doping into a semiconductor layer is used, in which an ionized impurity element for controlling conductivity is accelerated by an electric field, and made to pass through a portion of the gate electrode and a gate insulating film (a gate insulating film formed between the gate electrode and the semiconductor layer, and in close contact with both, and an insulating film extending in a region in the periphery of the gate insulating film, is included in the term gate insulating film for the present invention). In addition, the gate electrode is tapered so that the thickness thereof gradually increases from an edge portion of the gate electrode toward the inside, and concentration of the impurity element doped into the semiconductor layer is controlled by utilizing that change in thickness. Namely, the LDD region is formed so that the concentration of the impurity element gradually changes toward the longitudinal direction of the TFT channel.

Specifically, a first etching process is performed for a conductive layer forming the gate electrode, a predetermined region of the conductive layer is removed, and the gate insulating film is exposed in a portion of the region on the semiconductor layer. The conductive layer has a tapered shape at this point in which its thickness gradually increases from the edge portion toward the inside. A first doping process for adding a single conductivity type impurity element is then performed, and the formation of a first low concentration impurity region is performed. Next, a second etching process and a second doping process are similarly performed, and the formation of a second low concentration impurity region is performed. The LDD region is formed from the first and the second low concentration impurity regions. In this case the shape of the gate electrode is determined in accordance with the second etching process, and provided that suitable conditions for the second doping process are selected, a portion of the LDD region can be formed so as to overlap with the gate electrode.

The LDD region is thus formed in the present invention by repeating etching and doping processes a plurality of times. As a result, a plurality of LDD regions in which the concentration with respect to the longitudinal direction of the channel differs, and the impurity element concentration of the LDD region can be changed stepwise or continuously.

It is preferable to use a heat resistant conductive material for the conductive layer forming the gate electrode, and the conductive layer is formed from an element selected from the group consisting of tungsten (W), tantalum (Ta), and titanium (Ti), or from a compound or an alloy having the above elements as constituents. In order to etch this heat resistant conductive material at high speed and with good precision, and in addition, in order to form a tapered shape in the edge portion, it is preferable to apply a dry etching method using a high density plasma. An etching apparatus using microwaves or an inductively coupled plasma (ICP) is suitable as a means for obtaining the high density plasma. In particular, it is easy to control the plasma in an ICP etching apparatus, and it can also respond to a large surface area substrate.

As described above, according to a structure of the present invention, a semiconductor device having a semiconductor layer, an insulating film formed contacting the semiconductor layer, and a gate electrode having a tapered portion on the insulating film, is characterized in that:

the semiconductor layer has: a channel forming region; a first impurity region forming a source region or a drain region containing a single conductivity type impurity element; and a second impurity region forming an LDD region contacting the channel forming region;

a portion of the second impurity region is formed overlapping a gate electrode; and the concentration of the single conductivity type impurity element contained in the second impurity region increases as distance from the channel forming region increases.

This structure of the present invention can be suitably used in a semiconductor device in which TFTs are formed on a substrate. According to another structure of the present invention, a semiconductor device having an n-channel TFT and a p-channel TFT, is characterized in that:

the semiconductor layer of the n-channel TFT has: a channel forming region; a first impurity region forming a source region or a drain region containing a single conductivity type impurity element; and a second impurity region forming an LDD region contacting the channel forming region;

a portion of the second impurity region is formed overlapping a gate electrode;

the concentration of the single conductivity type impurity element contained in the second impurity region increases as distance from the channel forming region increases;

the semiconductor layer of the p-channel TFT has: a channel forming region; a third impurity region forming a source region or a drain region; and a fourth impurity region forming an LDD region contacting the channel forming region; and the single conductivity type impurity element and an impurity element, having a conductivity type which is inverse to the conductivity type of the single conductivity type impurity element, are contained in the third impurity region and the fourth impurity region.

A semiconductor device having a pixel portion is characterized in that:

the semiconductor layer of at least one TFT formed in each pixel of the pixel portion has: a channel forming region; a first impurity region forming a source region or a drain region containing a single conductivity type impurity element; and a second impurity region forming an LDD region contacting the channel forming region;

a portion of the second impurity region is formed overlapping a gate electrode; and the concentration of the single conductivity type impurity element contained in the second impurity region increases as distance from the channel forming region increases.

According to the present invention, a method of manufacturing a semiconductor device of the present invention has:

a first step of forming an insulating film on a semiconductor layer;

a second step of forming a conductive layer on the insulating film;

a third step of selectively etching the conductive layer, forming a conductive layer having a first tapered shape;

a fourth step of doping a single conductivity type impurity element into the semiconductor layer, after completing the third step;

a fifth step of selectively etching the conductive layer having the first tapered shape, forming a conductive layer having a second tapered shape; and a sixth step of doping a single conductivity type impurity element into the semiconductor layer, after completing the fifth step, the method being characterized in that the concentration of the single conductivity type impurity element doped in the sixth step is lower than the concentration of the single conductivity type impurity element doped in the fourth step.

This structure of the present invention can be suitably used in a semiconductor device in which TFTs are formed on a substrate. According to another structure of the present invention, a method of manufacturing a semiconductor device having an n-channel thin film transistor and a p-channel thin film transistor, has:

a first step of forming an insulating film on a semiconductor layer of the n-channel thin film transistor and that of the p-channel thin film transistor;

a second step of forming a conductive layer on the insulating film;

a third step of selectively etching the conductive layer, to form a conductive layer having a first tapered shape;

a fourth step of doping a single conductivity type impurity element into the semiconductor layers, after completing the third step;

a fifth step of selectively etching the conductive layer having the first tapered shape, to form a conductive layer having a second tapered shape;

a sixth step of doping a single conductivity type impurity element into the semiconductor layers, after completing the fifth step; and a seventh step of doping an impurity element, having a conductivity type which is inverse to the conductivity type of the single conductivity type impurity element, into the semiconductor layer of the p-channel thin film transistor, after completing the sixth step, the method being characterized in that the concentration of the single conductivity type impurity element doped in the sixth step is lower than the concentration of the single conductivity type impurity element doped in the fourth step.

According to still another structure of the present invention, a method of manufacturing a semiconductor device having a pixel portion has:

a first step of forming an insulating film on semiconductor layer that forms a TFT provided in each pixel portions;

a second step of forming a conductive layer on the insulating film;

a third step of selectively etching the conductive layer, forming a conductive layer having a first tapered shape;

a fourth step of doping a single conductivity type impurity element into the semiconductor layer, after completing the third step;

a fifth step of selectively etching the conductive layer having the first tapered shape, forming a conductive layer having a second tapered shape; and a sixth step of doping a single conductivity type impurity element into the semiconductor layer, after completing the fifth step, the method being characterized in that the concentration of the single conductivity type impurity element doped in the sixth step is lower than the concentration of the single conductivity type impurity element doped in the fourth step.

BRIEF DESCRIPTION OF THE DRAWINGS

In the accompanying drawings:

FIGS. 3A to 3D are cross sectional diagrams showing a method of manufacturing a pixel TFT and a driver circuit TFT;

FIGS. 5A and 5B are cross sectional diagrams showing the method of manufacturing the pixel TFT and the driver circuit TFT;

FIGS. 6A to 6C are cross sectional diagrams showing the method of manufacturing the pixel TFT and the driver circuit TFT;

FIGS. 20A and 20B are cross sectional diagrams of a pixel portion of an EL display device;

FIG. 30 is a graph showing a static property of the TFT.

DETAILED DESCRIPTION OF THE PREFERRED EMBODIMENTS

Embodiment Mode

Figure 1A:
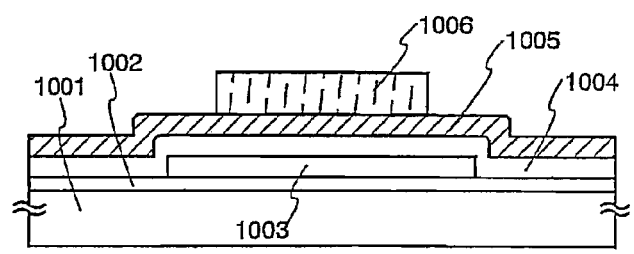
FIGS. 1A to 1D are diagrams for explaining a method of manufacturing a TFT of the present invention.

An Embodiment mode of the present invention is explained using FIGS. 1A to 2B-2. In addition to a glass substrate such as barium borosilicate glass or aluminum borosilicate glass, typically Corning Corp. #7059 or #1737 glass, a plastic substrate not having optical anisotropy such as polyethylene terephthalate (PET), polyethylene naphthalate (PEN), or polyether sulfone (PES) can be used in a substrate 1001 in FIG. 1A. Further, a quartz substrate may also be used. If a heat treatment is performed in advance at a temperature on the order of 10 to 20° C. less than the distortion point of the glass, when using a glass substrate, then changes in shape of the glass substrate by subsequent processes can be prevented.

A base film 1002, with a thickness of 10 to 200 nm, is formed from an insulating film such as a silicon oxide film, a silicon nitride film, or a silicon nitride oxide film on the surface of the substrate 1001 on which a TFT will be formed in order to prevent impurity element diffusion. The base film may be formed by one layer of the insulating film, and may also be formed by a plurality of layers.

An island-like semiconductor layer 1003 is formed from a crystalline semiconductor film in which a semiconductor film having an amorphous structure is crystallized by a method such as laser annealing, thermal annealing, or rapid thermal annealing (RTA). Further, a crystalline semiconductor film formed by a method such as sputtering, plasma CVD, or thermal CVD may also be used. Alternatively, a crystalline semiconductor layer 103b can also be formed by a crystallization method using a catalytic element, in accordance with a technique disclosed by Japanese Patent Application Laid-open No. Hei 7-130652. In this crystallization process, first it is preferable to remove hydrogen contained in the amorphous semiconductor layer, and if crystallization is performed after the amount of hydrogen contained is made equal to or less than 5 atom % by performing a heat treatment at 400 to 500° C. for approximately 1 hour, then roughness of the film surface can be prevented. Whichever method is used, the crystalline semiconductor film thus formed is selectively etched, forming the island-like semiconductor layer 1003 in a predetermined place.

Alternatively, an SOI (silicon on insulator) substrate in which a single crystal silicon layer is formed on the substrate 1001 may also be used. There are known many types of SOI substrate which vary in structure and in manufacturing method, and typically an SOI substrate such as SIMOX (separation by implanted oxygen), ELTRAN (epitaxial layer transfer, a trademark of Canon Corp.) substrate, or Smart-Cut (a trademark of SOITEC Corp.) can be used. Of course, it is also possible to use other SOI substrates.

A gate insulating film is formed by a method such as plasma CVD, sputtering, or reduced pressure CVD from an insulating film containing silicon and having a thickness of 40 to 150 nm. For example, it may be formed from a film such as a silicon oxide film, a silicon nitride film, or a silicon nitride oxide film. This is taken as a first shape gate insulating film 1004. A conductive layer 1005 is then formed on the first shape gate insulating film 1004 in order to form a gate electrode. It is preferable to form the conductive layer 1005 from a conductive material having heat resistance, and it may be formed from a single layer, or it may also have a lamination structure made from a plurality of layers, such as two layers or three layers, when necessary. For example, the conductive layer 1005 may be formed by an element selected from the group consisting of tungsten (W), tantalum (Ta), titanium (Ti), and molybdenum (Mo), or from an alloy with the above elements as constituents, or from an alloy film of a combination of the above elements. Further, the conductive layer 1005 may be formed with a lamination structure with a nitride compound of the above elements, such as tungsten nitride (WN), tantalum nitride (TaN), titanium nitride (TiN), or molybdenum nitride (MoN), or a silicide compound such as tungsten silicide, tantalum silicide, titanium silicide, or molybdenum silicide. A first shape mask 1006 is formed next. The first shape mask 1006 is formed by a photolithography technique using a resist material.

Figure 1B:
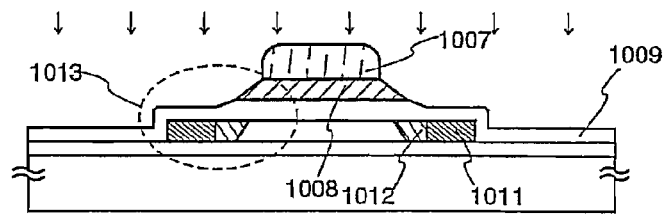

Etching of the conductive layer 1005 is performed next, as shown by FIG. 1B. The etching process is formed the tapered shape and performed to obtain the tapered portion at the edge portion of the conductive layer 1005 by use of the first shape mask. The etching process is performed using a dry etching method, preferably by using an ICP etching apparatus. A gas mixture of $CF_4$ and $Cl_2$ is used as an etching gas, and a bias voltage is applied to the substrate. A conductive layer 1008 having a first tapered shape on at least the island-like semiconductor layer 1003 is formed. The shape of the tapered portion can be changed in accordance with the etching gas mixture ratio, with the etching pressure, and with the bias voltage applied to the substrate. The bias voltage applied to the substrate is most able to control the tapered shape.

Dry etching is performed by elements such as fluorine (F) and chlorine (Cl), or by neutral particles or ionic particles of molecules containing fluorine or chlorine. Normally, etching proceeds in an isotropic manner if it is controlled by neutral particles, and a tapered shape is difficult to form. Etching proceeds in an anisotropic manner by applying a positive or a negative bias voltage to the substrate. Etching for forming a tapered shape is performed by applying a bias voltage to the substrate, and by etching the resist at the same time, with the difference in etching speed between the film and the resist (also referred to as selectivity ratio, and expressed as the etching speed of the process piece/etching speed of resist) having a value in a certain fixed range. By first making an appropriate resist shape, and then etching gradually from an edge portion of the resist, a tapered shape can be formed in the film underneath. The shape of the first shape mask 1006 also changes, forming a second shape mask 1007. Further, as etching proceeds, the surface of the gate insulating film 1004 under the conductive layer 1005 is exposed, and the gate insulating film is also etched to a certain extent from its surface, forming a second shape gate insulating film 1009.

The resist 1007 is then used as a mask, and a first doping process is performed. A single conductivity type impurity element is added to the island-like semiconductor layer 1003. An ion doping method or an ion injection method in which the impurity element is ionized, accelerated by an electric field, and then injected into the semiconductor layer is performed as the doping process. The single conductivity type impurity element passes through the gate insulating film and is added to the semiconductor layer beneath. A portion of the single conductivity type impurity element can be added to the semiconductor layer passing through an edge portion and the vicinity of the conductive layer 1008 having the first tapered shape.

A first impurity region 1011 contains a concentration of the single conductivity type impurity element from $1\times10^{20}$ to $1\times10^{21}$ atoms/cm$^3$. Further, the concentration of the impurity element added to the semiconductor layer in a second impurity region (A) 1012 is lower, compared to that of the first impurity region 1011 by the amount that the thickness of the second shape gate insulating film 1009 increases. A uniform concentration distribution is not always able to be obtained within the second impurity region (A) 1012, but the impurity element is added so as to be within a range of $1\times10^{17}$ to $1\times10^{20}$ atoms/cm$^3$.

Figures 1, 2A:
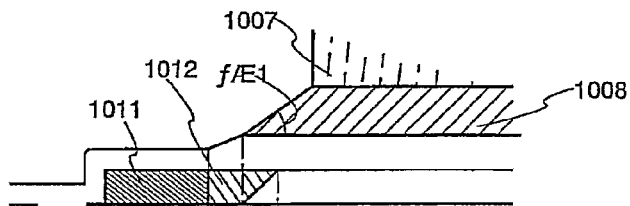
FIGS. 2A-1 to 2B-2 are diagrams for explaining the concentration distribution of an impurity element in an LDD region corresponding to FIGS. 1A to 1D.
Figures 2, 2A:
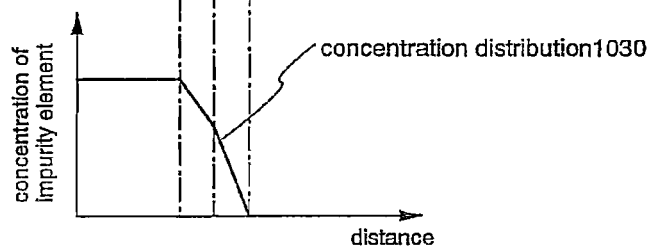

An enlarged view of a region 1013 surrounded by a dotted line in FIG. 1B is shown in FIGS. 2A-1. Further, FIGS. 2A-2 is a diagram which schematically expresses the concentration distribution of the impurity element in arbitrary units. The impurity region is formed under the gate insulating film and the tapered portion of the gate electrode. The concentration distribution of the impurity element is shown by a line 1030, and decreases with the distance from the first impurity region 1011. The ratio of the decrease differs depending on the acceleration voltage and the dosage amount during ion doping, and with an angle θ1 of the tapered portion and the thickness of the first shape gate electrode 1008.

Figure 1C:
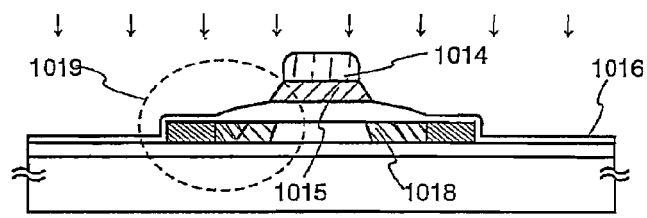

A second etching process is performed next, as shown in FIG. 1C. The second etching process is an anisotropic etching and etches the first shape gate electrode 1008 so as to make the width of the channel longitudinal direction shorter. The method of etching is the same as that of the first etching process, and an ICP etching apparatus is used. A gas mixture of CF$_4$ and Cl$_2$ is used as an etching gas, and a bias voltage is applied to the substrate, forming a conductive layer 1015 having a second tapered shape. In the second etching process also, a portion of the gate insulating film as a base film is etched from the surface thereby formed a gate insulating film 1016 having the second tapered shape. An enlarged view of a region 1019 enclosed by a dotted line is shown in FIG. 1C, and although a tapered portion is also formed in an edge portion of the second tapered shape conductive layer 1015, a taper angle θ2 becomes larger than θ1 because of the etching process in which the width of the channel longitudinal direction has been made shorter.

The resist 1014 is then used as a mask, a second doping process is performed, and a single conductivity type impurity element is added to the island-like semiconductor layer 1003. In this case, a portion of the impurity element can passes through the edge portion of the second tapered shape conductive layer 1015 and its vicinity, and can be added to the semiconductor layer below.

Figures 1, 2B:
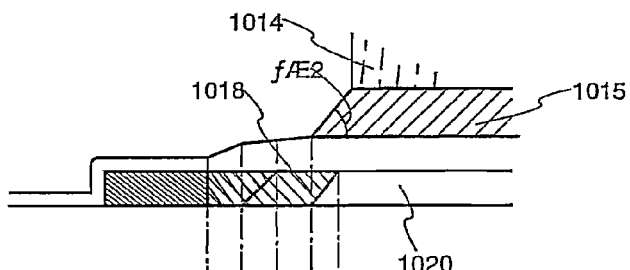
Figures 2, 2B:
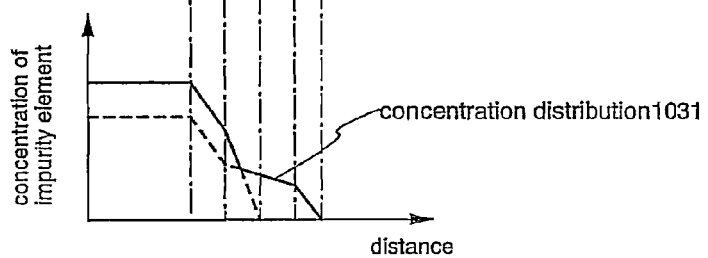

The second doping process is performed so that the single conductivity type impurity element is contained at a concentration of $1\times10^{16}$ to $5\times10^{18}$ atoms/cm$^3$ in the semiconductor layer. As also shown in FIG. 2B-2, the single conductivity type impurity element is added by this process to the first impurity region 1011 and to the second impurity region (A) 1012 formed by the first doping process but the amount added is low, and therefore its influence can be ignored. A newly formed second impurity region (B) 1018 is made to contain the single conductivity type impurity element at a concentration of $1\times10^{16}$ to $5\times10^{18}$ atoms/cm$^3$. The second impurity region (B) 1018 reduces the concentration of the impurity element added to the semiconductor layer by the amount that the thickness of the second tapered shape conductive layer 1016 increases, and although a uniform concentration distribution cannot necessarily be obtained within the second impurity region (B) 1018, the impurity element is contained within the above concentration range.

The second impurity region (B) 1018 is formed under the second shape gate insulating film 1016 and under the tapered portion of the second tapered shape conductive layer 1015. Its concentration distribution of the impurity element is shown by a line 1031, and decreases with a distance from the first impurity region 1011. The second tapered shape conductive layer 1015 is used as a gate electrode. By making the edge portion of the gate electrode having a tapered shape, and by doping the impurity element through the tapered portion, an impurity region can thus be formed in the semiconductor layer existing under the tapered portion in which the concentration of the impurity element changes gradually. The present invention actively utilizes this impurity region. By forming this type of impurity region, a high electric field developing in the vicinity of the drain region is relieved, then the deterioration of the TFT can be prevented because of generation of hot carriers.

Figure 1D:
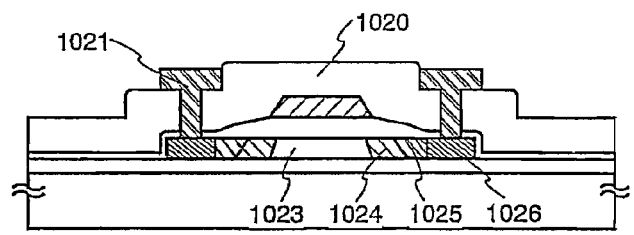

Thus the first impurity region 1026 which becomes a source region or a drain region, the second impurity region (A) which forms the LDD region 1025 not overlapping the gate electrode, the second impurity region (B) which forms the LDD region 1024 overlapping a portion of the gate electrode, and a channel forming region 1023 are formed in the island-like semiconductor layer 1003. Then, when necessary, an interlayer insulating film 1020 may be formed, and a wiring 1021 which contacts with the source region or the drain region may be formed, as shown in FIG. 1D.

Embodiment 1

An Embodiment of the present invention is explained using FIGS. 3A to 5B. A method of manufacturing a pixel TFT and a storage capacitor of a pixel portion, and a driver circuit TFT formed in the periphery of the pixel portion, at the same time is explained in detail here in accordance with process steps.

In FIG. 3A, a glass substrate such as barium borosilicate glass or aluminum borosilicate glass, typically Corning Corp. #7059 or #1737 glass, or a quartz substrate is used as a substrate 101. When using a glass substrate, heat treatment may be performed in advance at a temperature between 10 and 20 EC below the distortion temperature of the glass. A base film 102 is then formed from an insulating film such as a silicon oxide film, a silicon nitride film, or a silicon nitride oxide film on the surface of the substrate 101 on which a TFT will be formed, in order to prevent impurity element diffusion. For example, a lamination of a silicon nitride oxide film 102a having a thickness of 10 to 200 nm (preferably between 50 and 100 nm) and manufactured by plasma CVD using $SiH_4$, $NH_3$, and $N_2O$, and a hydrogenated silicon nitride oxide film 102b having a thickness of 50 to 200 nm (preferably between 100 and 150 nm) and manufactured similarly from $SiH_4$ and $N_2O$ is formed. A two layer structure is shown for the base film 102 here, but a single layer film of the above insulating films, or a lamination film having more than two layers may also be formed.

The silicon nitride oxide film is formed using a parallel plate type plasma CVD method. For the silicon nitride oxide film 102a, $SiH_4$, $NH_3$, and $N_2O$ are introduced to a reaction chamber at 10 SCCM, 100 SCCM, and 20 SCCM, respectively, the substrate temperature is set to 325 EC, the reaction pressure is 40 Pa, the emission power density is set to 0.41 $W/cm^2$, and the emission frequency is 60 MHz. On the other hand, for the hydrogenated silicon nitride oxide film 102b, $SiH_4$, $N_2O$, and $H_2$ are introduced to the reaction chamber at 5 SCCM, 120 SCCM, and 125 SCCM, respectively, the substrate temperature is set to 400 EC, the reaction pressure is 20 Pa, the emission power density is set to 0.41 $W/cm^2$, and the emission frequency is 60 MHz. These films can be formed in succession by changing the substrate temperature and switching the reaction gasses.

The silicon nitride oxide film 102a thus manufactured has a density of $9.28 \times 10^{22}/cm^3$, has a slow etching speed of approximately 63 nm/min when etched by a mixed solution containing 7.13% ammonium bifluoride ($NH_4HF_2$) and 15.4% ammonium fluoride ($NH_4F$) (Stella Chemifor Corp., product name LAL500) at 20 EC. If this type of film is used in the base film, then the base film is effective in preventing diffusion of alkaline metal elements from the glass substrate into the semiconductor layer formed on the base film.

Next, a semiconductor layer 103a having an amorphous structure is formed by a method such as plasma CVD or sputtering to a thickness of 20 to 80 nm (preferably between 30 and 60 nm). Amorphous semiconductor layers and microcrystalline semiconductor films exist in semiconductor films having an amorphous structure, and a chemical compound semiconductor film having an amorphous structure such as an amorphous silicon germanium film may also be applied. When forming an amorphous silicon film by plasma CVD, it is possible to form both the base film 102 and the amorphous semiconductor layer 103a in succession. For example, as stated above, after forming the silicon nitride oxide film 102a and the hydrogenated silicon nitride oxide film 102b successively by plasma CVD, the amorphous semiconductor layer 103a can be formed in succession without exposure to the atmosphere by switching the reaction gasses from $SiH_4$, $N_2O$, and $H_2$ to $SiH_4$ and $H_2$. As a result, it becomes possible to ward off contamination of the surface of the hydrogenated silicon nitride oxide film 102b, and a dispersion in the characteristics of the manufactured TFTs and fluctuations in their threshold voltage can be lowered.

A crystallization process is then performed, and a crystalline semiconductor layer 103b is manufactured from the amorphous semiconductor layer 103a. Laser annealing, thermal annealing (solid state growth method), and rapid thermal annealing (RTA method) can be applied as the crystallization method. When using a glass substrate such as those stated above, or a plastic substrate with inferior heat resistance, it is particular preferable to apply laser annealing. An light source such as an infrared lamp, a halogen lamp, a metal halide lamp, or a xenon lamp is used by the RTA method. Alternatively, the crystalline semiconductor layer 103b can be formed by a crystallization method using a catalytic element, in accordance with a technique disclosed by Japanese Patent Application Laid-open No. Hei. 7-130652. In this crystallization process, first it is preferable to release hydrogen contained in the amorphous semiconductor layer, and if the crystallization is performed after the amount of hydrogen contained is made equal to or less than 5 atom % by performing heat treatment at 400 to 500 EC for approximately 1 hour, then roughness of the film surface can be prevented.

Further, $SiH_4$ and argon (Ar) are used in a reaction gas in a process of forming an amorphous silicon film by plasma CVD, and if the substrate temperature is set from 400 to 450 EC at the time of film deposition, then the concentration of hydrogen contained within the amorphous silicon film can also be made equal to or less than 5 atomic %. The heat treatment for releasing hydrogen becomes unnecessary in this case.

When performing crystallization by laser annealing, a pulse emission type or a continuous emission type excimer laser, or an argon laser is used as the light source. Laser light is processed into a linear shape and then laser annealing is performed when using a pulse emission type excimer laser. The conditions of laser annealing may be suitably determined by the operator, but for example, the laser pulse emission frequency is set to 30 Hz, and the laser energy density is set from 100 to 500 $mJ/cm^2$ (typically between 300 and 400 $mJ/cm^2$). The linear shape beam is then irradiated over the entire surface of the substrate, and this is performed with an overlap ratio of 80 to 98% for the linear shape beam. Thus the crystalline semiconductor layer 103b can be obtained, as shown in FIG. 3B.

A resist pattern is then formed using a photolithography technique employing a first photomask PM1 on the crystalline semiconductor layer 103b. The crystalline semiconductor layer is then partitioned into island-like shapes by dry etching, forming the island-like semiconductor layers 104 to 108, as shown in FIG. 3C. A gas mixture of $CF_4$ and $O_2$ is used in the dry etching of the crystalline silicon film.

An impurity element which imparts p-type conductivity may then be added at a concentration of $1 \times 10^{16}$ to $5 \times 10^{17}$ atoms/$cm^3$ to the entire surface of the island-like semiconductor layers, with an aim of controlling the threshold voltage (Vth) of the TFTs. Elements existing in periodic table group 13, such as boron (B), aluminum (Al), and gallium (Ga) are known as impurity elements which will impart p-type conductivity with respect to semiconductors. Ion injection and ion doping (or ion shower doping) can be used as the method of adding the impurity element, though ion doping is suitable for processing a large surface area substrate. Boron (B) is added by ion doping using diborane ($B_2H_6$) as a source gas. This type of impurity element injection is not always necessary and may be omitted without any hindrance. In particular it is a method appropriately used in order to keep the threshold voltage of an n-channel TFT within a predetermined range.

A gate insulating film 109 is formed with a thickness of 40 to 150 nm from an insulating film containing silicon by plasma CVD or sputtering. In Embodiment 1, a 120 nm thick silicon nitride oxide film is used to form the gate insulating film 109. Further, a silicon nitride oxide film formed by adding $O_2$ to $SiH_4$ and $N_2O$ has a reduced fixed charge density within the film therefore it is a preferable material for this type of use. Furthermore, a silicon nitride oxide film manufactured from $SiH_4$, $N_2O$ and $H_2$ has a lowered defect density in the boundary with the gate insulating film, which is preferable. Of course, as the gate insulating film is not limited to this type of silicon nitride oxide film, other insulating films containing silicon may also be used, in a single layer or a multiple layer structure. For example, when using a silicon oxide film, it can be formed by plasma CVD with a mixture of TEOS (tetra-ethyl orthosilicate) and $O_2$, at a reaction pressure of 40 Pa, with the substrate temperature set from 300 to 400 EC, and by discharging at a high frequency (13.56 MHz) electric power density of 0.5 to 0.8 W/cm². Good characteristics as a gate insulating film can be obtained by subsequently performing thermal annealing of the silicon oxide film thus manufactured at 400 to 500 EC.

A heat resistant conductive layer 111 for forming a gate electrode is then formed with a thickness of 200 to 400 nm (preferably between 250 and 350 nm) on the first shape gate insulating film 109, as shown in FIG. 3D. The heat resistant conductive layer may be formed by a single layer and may also be a lamination structure composed of a plurality of layers such as a two layers or three layers structure, when necessary. In this specification, the heat resistant conductive layer contains an element chosen from the group consisting of Ta, Ti, W and Mo or an alloy of the above elements, or an alloy film of a combination of said elements. These heat resistant conductive layers are formed by sputtering or CVD, and it is preferable to reduce the impurity element concentration contained in order to make the resistance low. In particular, it is preferable to make the concentration of oxygen equal to or less than 30 ppm. A 300 nm thick W film is formed in Embodiment 1. The W film may be formed by sputtering with W as a target, and can also be formed by thermal CVD using tungsten hexafluoride ($WF_6$). Whichever is used, it is necessary to be able to make the film become low resistance in order to use as the gate electrode, and it is preferable that the resistivity of the W film be made equal to or less than 20 μΩcm. The resistivity can be lowered by enlarging the crystals of the W film, but for cases in which there are a many impurity elements such as oxygen within the W film, crystallization is inhibited, and the film becomes high resistance. Thus a W target having a purity of 99.9999% is used in sputtering, and by additionally forming the W film taking sufficient care so as not to introduce any impurities from within the gas phase at the time of film deposition, a resistivity of 9 to 20 μΩcm can be achieved.

When using a Ta film in the heat resistant conductive layer, it is possible to form the Ta film similarly by sputtering. Ar is used in the sputtering gas for the Ta film. Further, if an appropriate amount of Xe and Kr are added to the gas at the time of sputtering, then the internal stress of the film formed is relaxed, and film peeling can be prevented. The resistivity of an α phase Ta film is on the order of 20 μΩcm, and it can be used in the gate electrode, but the resistivity of a β phase Ta film is on the order of 180 μΩcm and it is unsuitable for the gate electrode. A TaN film possesses a crystal structure which is close to that of α phase Ta film, and therefore an α phase Ta film can easily be obtained provided that a TaN film is formed under the Ta film. Further, although not shown in the figures, it is effective to form a silicon film doped by phosphorous (P) and having a thickness on the order of 2 to 20 nm under the heat resistant conductive layer 111. By doing that increasing the adhesion and preventing oxidation of the conductive film formed on top, at the same time alkaline metal elements contained in the heat resistant conductive layer 111 in microscopic amounts can be stopped from diffusing into the first shape gate insulating film 109 by doing so. Whichever is used, it is preferable that the resistivity of the heat resistant conductive layer 111 be in a range from 10 to 50 μΩcm.

Next, masks 112 to 117 are resists formed by a photolithography technique using a second photomask PM2. A first etching process which is a taper etching is then performed. The etching is performed in Embodiment 1 using an ICP etching apparatus, using $Cl_2$ and $CF_4$ as etching gasses, inputting an RF (13.56 MHz) power of 3.2 W/cm² at 1 Pa of pressure to form a plasma. A 224 mW/cm² RF (13.56 MHz) power is also introduced to the substrate side (sample stage), and therefore a negative self bias voltage is effectively applied. The etching speed of the W film is approximately 100 nm/min under these conditions. The etching time in order to exactly etch the W film is estimated based on this etching speed, further an etching time for the first etching process is set at 20% more greater than the estimated etching time.

Conductive layers having a first tapered shape 118 to 123 are formed by the first etching process. The angle of the tapered portions is formed from 15 to 30 E similar to that shown by FIG. 2A. In order to perform etching without leaving any residual, over etching is performed in which the etching time is increased by a ratio on the order of 10 to 20%. The selectivity of a silicon nitride oxide film (the first shape gate insulating film 109) with respect to the W film is between 2 and 4 (typically 3), and therefore the exposed surface of the silicon nitride oxide film is etched on the order of 20 to 50 nm by the over etching process, and a second shape gate insulating film 134, in which a tapered shape is formed in near the edge portion of the conductive layer having the first tapered shape, is formed.

A first doping process is then performed, adding a single conductivity type impurity element into the island-like semiconductor layers. A process of adding an impurity element which imparts n-type conductivity is performed here. The masks 112 to 117 for forming the first shape conductive layers are left as it is, and with the first tapered shape conductive layers 118 to 123 are used as a mask, the impurity element which imparts n-type conductivity is added by ion doping in a self-aligning manner. The ion doping is performed using a dosage amount of $1 \times 10^{13}$ to $5 \times 10^{14}$ atoms/cm² and with the acceleration voltage set between 80 and 160 keV in order for the n-type conductivity imparting impurity element to be added so as to pass through the tapered portion in the edge portion of the gate electrode and through the gate insulating film, and so as to reach the semiconductor layers placed below. An element residing in periodic table group 15 is used as the impurity element which imparts n-type conductivity, typically phosphorous (P) or arsenic (As), and phosphorous (P) is used here. The impurity element to which imparts n-type conductivity is added to first impurity regions 124 to 128 here by the ion doping process at a concentration in the range of $1 \times 10^{20}$ to $1 \times 10^{21}$ atoms/cm³. Although there is not necessarily a uniform concentration within second impurity regions (A) formed below the tapered portion, the n-type conductivity imparting impurity element is added within a range of $1 \times 10^{17}$ to $1 \times 10^{20}$ atoms/cm³.

The change in concentration of the n-type conductivity imparting impurity element contained in a portion of second impurity regions (A) 129 to 133 overlapping at least the first shape conductive layers 118 to 123 reflects the change in thickness of the tapered portion. In other words, the concentration of phosphorous (P) added to the second impurity regions (A) 129 to 133 gradually becomes less from the edge portion of the conductive layers toward the inside in the region overlapping with the first shape conductive layers. The concentration of phosphorous (P) reaching the semiconductor layers changes due to the difference in a film thickness of the tapered portion, and that the concentration change is as shown in FIG. 2A-2.

Figure 4A:
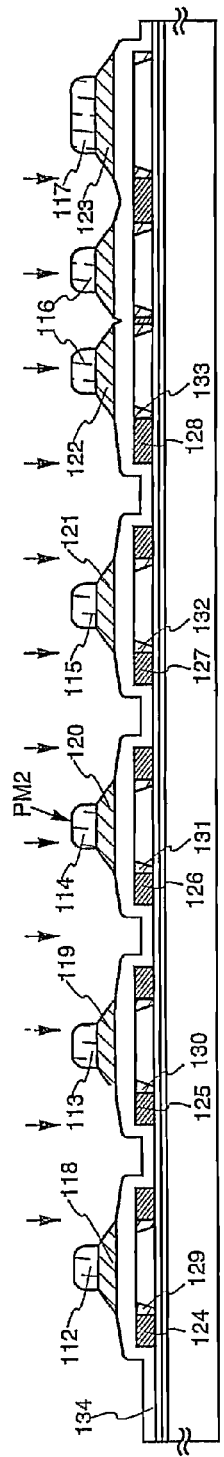
FIGS. 4A to 4C are cross sectional diagrams showing the method of manufacturing the pixel TFT and the driver circuit TFT.
Figure 4B:
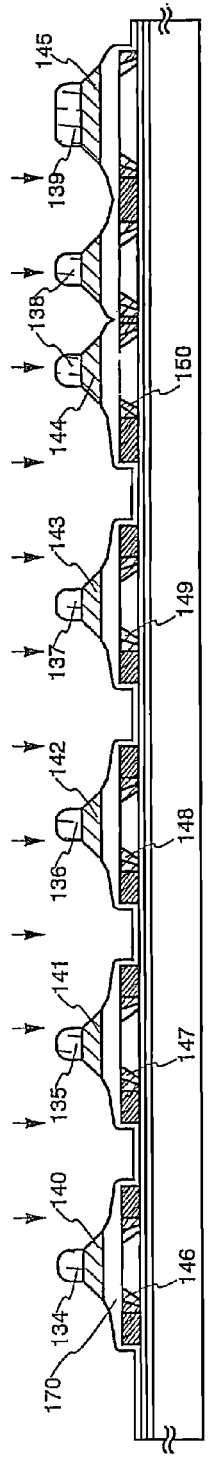
Figure 4C:
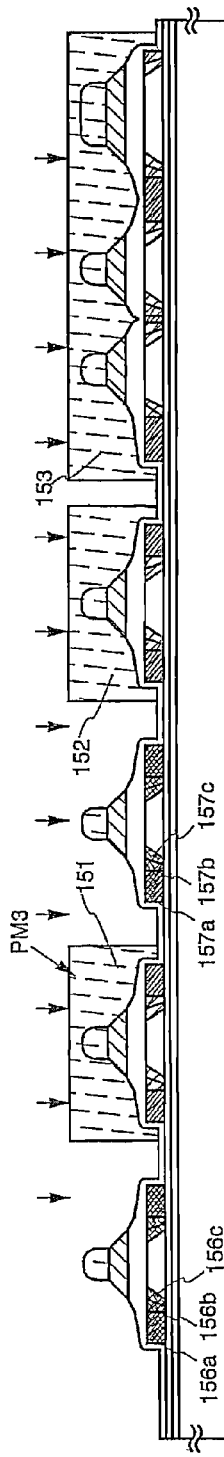

A second etching process which is an anisotropic process is performed next, as shown in FIG. 4B. The etching process is also similarly performed by an ICP etching apparatus with a mixed gas of $CF_4$ and $Cl_2$ used in the etching gas, the etching is performed with an RF power of 3.2 $W/cm^2$ (13.56 MHz), a bias power of 45 $mW/cm^2$ (13.56 MHz), and at a pressure of 1.0 Pa. Conductive layers having a second shape 140 to 145 formed under this conditions are formed. A tapered portion is formed in each edge portions, and this becomes a tapered shape in which the thickness gradually increases from the edge portion toward the inside. Compared with the first etching process, the ratio of anisotropic etching becomes greater in the substrate side by the amount that the applied bias power is reduced, and the angle of the tapered portion becomes to from 30 to 60°. Further, the surface of the second shape gate insulating film 134 is etched on the order of 40 nm, newly forming a third shape gate insulating film 170.

An impurity element which imparts n-type conductivity is then doped at conditions of a dosage amount lower than that of the first doping process, and at a high acceleration voltage. For example, the acceleration voltage is set between 70 and 120 keV, and doping is performed with a dosage amount of $1 \times 10^{13}$ $atoms/cm^2$, so as to make the impurity concentration in a region overlapping with the second shape semiconductive layers 140 to 145 be from $1 \times 10^{16}$ and $1 \times 10^{18}$ $atoms/cm^3$. Second impurity regions (B) 146 to 150 are thus formed.

Impurity regions 156 and 157, having a conductivity type which is the inverse of the single conductivity type impurity element, are then formed in the island-like semiconductor layers 104 and 106 which form p-channel TFTs. The second shape conductive layers 140 and 142 are used as a mask in this case as well, and an impurity element which imparts p-type conductivity is added. The impurity regions are formed in a self-aligning manner. The island-like semiconductor layers 105, 107, and 108, which form n-channel TFTs, are covered over their entire surfaces by resist masks 151 to 153, formed using a third photomask PM3. Impurity regions 156 and 157 formed here are formed by ion doping using diborane ($B_2H_6$). The concentration of the p-type conductivity imparting impurity element in the impurity regions 156 and 157 is set so as to become $2 \times 10^{20}$ to $2 \times 10^{21}$ $atoms/cm^3$.

However, in detail the impurity regions 156 and 157 can be seen as being divided into three regions containing n-type conductivity imparting impurity elements. Third impurity regions 156a and 157a contain the impurity element which imparts n-type conductivity at a concentration of $1 \times 10^{20}$ to $1 \times 10^{21}$ $atoms/cm^3$, fourth impurity regions (A) 156b and 157b contain the impurity element which imparts n-type conductivity at a concentration of $1 \times 10^{17}$ and $1 \times 10^{20}$ $atoms/cm^3$, and fourth impurity regions (B) 156c and 157c contain a concentration of the n-type conductivity imparting impurity element from $1 \times 10^{16}$ and $1 \times 10^{18}$ $atoms/cm^3$. However, the concentration of the impurity element which imparts p-type conductivity is set so as to be equal to or greater than $1 \times 10^{19}$ $atoms/cm^3$ in the impurity regions 156b, 156c, 157b, and 157c, and in the third impurity regions 156a and 157a, the concentration of the p-type conductivity imparting impurity element is made to be from 1.5 to 3 times as high, and therefore no problems will develop when the third impurity regions function as a source region and a drain region of a p-channel TFT. Further, a portion of the fourth impurity regions (B) 156c and 157c is formed so as to overlap with a portion of the second tapered shape conductive layer 140 or 142.

Next, as shown in FIG. 5A, a first interlayer insulating film 158 is formed on the gate electrode and the gate insulating film. The first interlayer insulating film may be formed by a silicon oxide film, a silicon nitride oxide film, a silicon nitride film, or a lamination film of a combination of these films. Whichever is used, the first interlayer insulating film 158 is formed from an inorganic insulating material. The film thickness of the first interlayer insulating film 158 is set from 100 to 200 nm. When using a silicon oxide film here, it can be formed by plasma CVD with a mixture of TEOS and $O_2$, at a reaction pressure of 40 Pa, with the substrate temperature set from 300 to 400 EC, and by discharging at a high frequency (13.56 MHz) electric power density of 0.5 to 0.8 $W/cm^2$. Further, when using a silicon nitride oxide film, the silicon nitride oxide film may be manufactured by plasma CVD from $SiH_4$, $N_2O$, and $NH_3$, and the silicon nitride oxide film may be manufactured from $SiH_4$ and $N_2O$. The manufacturing conditions in this case are a reaction pressure of 20 to 200 Pa, a substrate temperature set from 300 to 400° C., and the film can be formed by applying a high frequency (60 MHz) electric power density of 0.1 to 1.0 $W/cm^2$. Further, a hydrogenated silicon nitride oxide film manufactured from $SiH_4$, $N_2O$, and $H_2$ may also be applied. It is also possible to manufacture a silicon nitride film from $SiH_4$, and $NH_3$ similarly by plasma CVD.

A process of activating the n-type and p-type conductivity imparting impurity element added at their respective concentrations is then performed. Thermal annealing using an annealing furnace is performed for this process. In addition, laser annealing and rapid thermal annealing (RTA) can also be applied. Thermal annealing is performed with an oxygen concentration equal to or less than 1 ppm, preferably equal to or less than 0.1 ppm, in a nitrogen atmosphere at 400 to 700° C., typically between 500 and 600° C. Heat treatment is performed for 4 hours at 550° C. in Embodiment 1. Further, it is preferable to apply laser annealing when a plastic substrate having a low heat resistance temperature is used as the substrate 101.

After the activation process the gas atmosphere is changed, and heat treatment is performed for 1 to 12 hours at 300 to 450° C. in an atmosphere containing between 3 and 100% hydrogen, performing hydrogenation of the island-like semiconductor layers. This process is one of terminating from $10^{16}$ to $10^{18}/cm^3$ of dangling bonds in the island-like semiconductor layers by hydrogen which is thermally excited. Plasma hydrogenation (using hydrogen excited by a plasma) may also be performed as another means of hydrogenation. Whichever is used, it is preferable to reduce the defect density within the island-like semiconductor layers 104 to 108 to $10^{16}/cm^3$ or less, and hydrogen may be imparted on the order of 0.01 to 0.1 atomic %.

By forming a second interlayer insulating film from an organic insulating material, the surface can be made very level. Further, an organic resin material generally has a low dielectric constant therefore the parasitic capacitance can be reduced. However, it absorbs moisture and is not suitable as a protecting film therefore it is used in combination with the first interlayer insulating film 158 formed by a film such as a silicon oxide film, a silicon nitride oxide film, or a silicon nitride film.

Next, a resist mask is formed with a predetermined pattern using a fourth photomask PM4, and contact holes are formed in each of the island-like semiconductor layers in order to reach the impurity regions formed as source regions or drain regions. The contact holes are formed by dry etching. In this case, a second interlayer insulating film 159 made from an organic resin material is etched using a gas mixture of $CF_4$, $O_2$, and He. Afterward, the first interlayer insulating film 158 is etched in succession using an etching gas of $CF_4$ and $O_2$. In addition, the contact holes can be formed by etching the third shape gate insulating film 170, where the etching gas is switched to $CHF_3$ in order to increase the selectivity with the island-like semiconductor layers.

A conductive metallic film is then formed by sputtering or vacuum evaporation, and a resist mask pattern is formed by a fifth photomask PM5. Source lines 160 to 164 and drain lines 165 to 168 are formed by etching. A pixel electrode 169 is formed with the drain lines. A pixel electrode 171 denotes a pixel electrode belonging to a neighboring pixel. Although not shown in the figures, in Embodiment 1 Ti films are formed with a thickness of 50 to 150 nm, contacts with the impurity regions forming the source or drain regions of the island-like semiconductor layers is formed, aluminum (Al) films having a thickness of 300 to 400 nm is formed on the Ti film (shown by reference numerals 160a to 169a in FIG. 5B), and in addition, transparent conductive films with a thickness of 80 to 120 nm are formed on the aluminum film (shown by reference numerals 160b to 169b in FIG. 5C) for the wirings. An indium oxide zinc oxide alloy ($In_2O_3$—ZnO) or zinc oxide (ZnO) is the material applied suitably to the transparent conductive film, and in addition, a material such as zinc oxide in which gallium (Ga) has been added (ZnO:Ga) in order to increase the transmittivity of optical light and to increase the conductivity can also be used preferably.

The substrate, having the driver circuit TFTs and the pixel TFTs of the pixel portion on the same substrate, can thus be completed by using 5 photomasks. A first p-channel TFT 200, a first n-channel TFT 201, a second p-channel TFT 202, and a second n-channel TFT 203 are formed in the driver circuit, and a pixel TFT 204 and a storage capacitor 205 are formed in the pixel portion. This type of substrate is referred to as an active matrix substrate throughout this specification for convenience.

In the first p-channel TFT 200 of the driver circuit, a conductive layer having the second tapered shape functions as a gate electrode 220. The structure of the island-like semiconductor layer 104 has a channel forming region 206, a third impurity region 207a which functions as a source region or a drain region, a fourth impurity region (A) 207b which forms an LDD region not overlapping the gate electrode 220, and a fourth impurity region (B) 207c which forms an LDD region overlapping a portion of the gate electrode 220.

In the first n-channel TFT 201, a conductive layer having the second tapered shape functions as a gate electrode 221. The structure of the island-like semiconductor layer 105 has a channel forming region 208, a first impurity region 209a which functions as a source region or a drain region, a second impurity region (A) 209b which forms an LDD region not overlapping the gate electrode 221, and a second impurity region (B) 209c which forms an LDD region overlapping a portion of the gate electrode 221. The length of the portion in which the second impurity region (B) 209c overlaps the gate electrode 221 is set from 0.1 to 0.3 μm with respect to a channel length of 2 to 7 μm. This length Lov is controlled by the thickness of the gate electrode 221 and by the angle of the tapered portion. By forming this type of LDD region in an n-channel TFT, the high electric field which develops near the drain region is relieved, and the development of hot carriers is blocked, then deterioration of the TFT can be prevented.

In the second p-channel TFT 202 of the driver circuit, a conductive layer having the second tapered shape similarly functions as a gate electrode 222. The structure of the island-like semiconductor layer 106 has a channel forming region 210, a third impurity region 211a which functions as a source region or a drain region, a fourth impurity region (A) 211b which forms an LDD region not overlapping the gate electrode 222, and a fourth impurity region (B) 211c which forms an LDD region overlapping a portion of the gate electrode 222.

In the second n-channel TFT 203 of the driver circuit, a conductive layer having the second tapered shape functions as a gate electrode 223. The structure of the island-like semiconductor layer 107 has a channel forming region 212, a first impurity region 213a which functions as a source region or a drain region, a second impurity region (A) 213b which forms an LDD region not overlapping the gate electrode 223, and a second impurity region (B) 213c which forms an LDD region overlapping a portion of the gate electrode 223. The length of the portion in which the second impurity region (B) 213c overlaps the gate electrode 223 is set similar to that of the second n-channel TFT 201, from 0.1 to 0.3 μm.

The driver circuit is formed by logic circuits such as a shift register circuit and a buffer circuit, and by circuits such as a sampling circuit formed by an analog switch. In FIG. 5B, TFTs for forming these circuits are shown by a single gate structure in which one gate electrode is formed between a source and drain pair, but a multi-gate structure in which a plurality of gate electrodes are formed between source and drain pairs may also be used without hindrance.

In the pixel TFT 204 of the driver circuit, a conductive layer having the second tapered shape functions as a gate electrode 224. The structure of the island-like semiconductor layer 108 has channel forming regions 214a and 214b, first impurity region 215a and 217 which function as source regions or drain regions, a second impurity region (A) 215b which forms an LDD region not overlapping the gate electrode 224, and a second impurity region (B) 215c which forms an LDD region overlapping a portion of the gate electrode 224. The length of the portion in which the second impurity region (B) 213c overlaps the gate electrode 224 is set from 0.1 to 0.3 μm. Further, a storage capacitor is formed from: a semiconductor layer which extends from the first impurity region 217 and has a second impurity region (A) 219b, a second impurity region (B) 219c, and a region 218 to which is not added impurity elements determining the conductivity type; an insulating layer formed by the same layer as the gate insulating film having the third shape; and a capacitor wiring 225 formed from the second tapered shape conductive layer.

Figure 11:
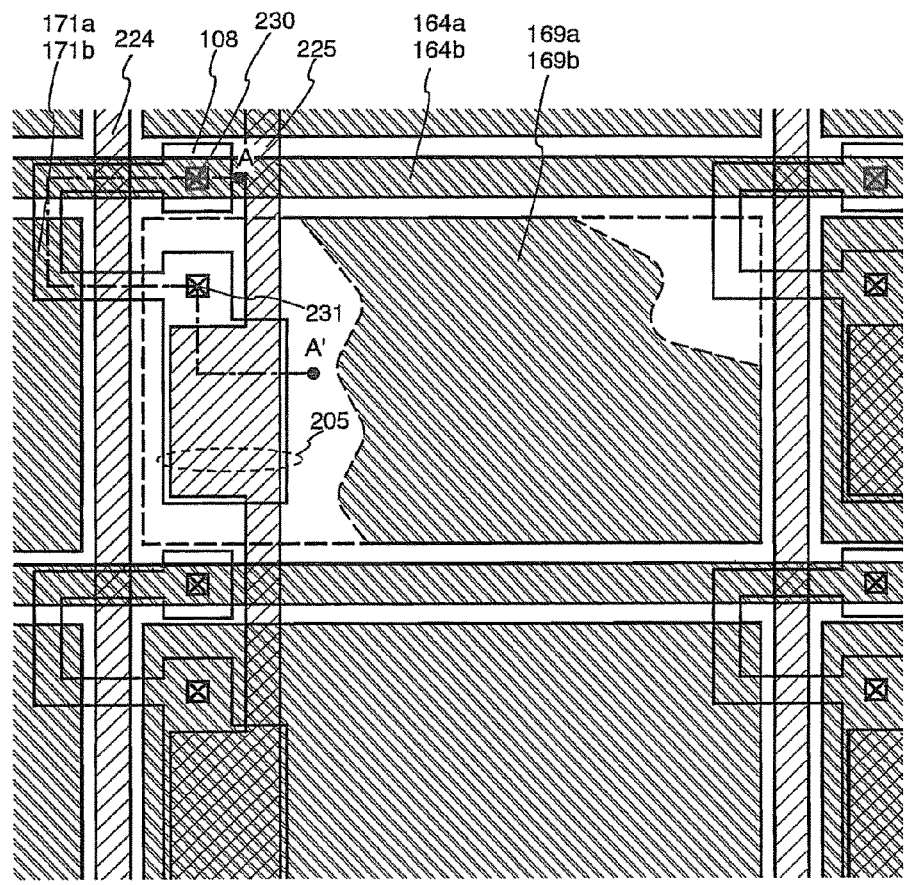
FIG. 11 is a top view showing a pixel of a pixel portion.

FIG. 11 is a top view showing approximately one pixel of the pixel portion. A cross section along the line A-A' shown in the figure corresponds to the cross sectional diagram of the pixel portion shown in FIG. 5B. In the pixel TFT 204, a gate electrode 224 intersects, through a gate insulating film not shown in the figure, with the island-like semiconductor layer 108 formed below and stretches over a plurality of island-like semiconductor layers furthermore to serve as the gate wiring. Although not shown in the figure, a source region, a drain region, and an LDD region are formed in the island-like semiconductor layers, as explained by FIG. 5B. Further, reference numeral 230 denotes a contact portion of the source wiring 164 and the source region 215a, reference numeral 231 denotes a contact portion of the pixel electrode 169 and a drain region 217. The storage capacitor 205 is formed by a region in which the semiconductor layer extending from the drain region 217 of the pixel TFT 204 and the capacitor wiring 225 overlap, through the gate insulating film. An impurity element for controlling valence electrons is not added in the semiconductor layer 218 in this structure.

A structure such as that above optimizes the structure of the pixel TFT and TFTs composing each circuits of the driver circuit in response to the specifications required, and it is possible to increase the operating performance and the reliability of the semiconductor device. In addition, by forming the gate electrode using a conductive material having heat resistance, the LDD regions, and source regions and drain regions are easily activated. Moreover, when forming the LDD region overlapping the gate electrode through the gate insulating film, in particular it can be expected that the relieving effect for the electric field formed near the drain region will increase by forming the LDD region to possess a concentration gradient of an impurity element added with the aim of controlling the conductivity type.

Figure 9A:
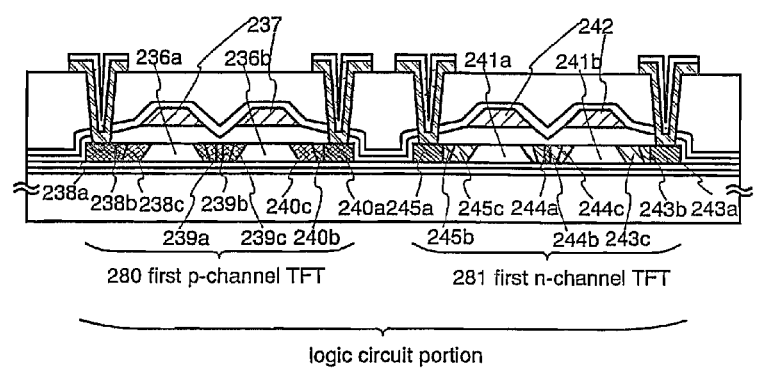
FIGS. 9A and 9B are cross sectional diagrams showing the structure of driver circuit TFTs.

For a case of an active matrix type liquid crystal display device, the first p-channel TFT 200 and the first n-channel TFT 201 are used to form circuits such as a shift register circuit, a buffer circuit, and a level shifter circuit which place importance on high speed operation. In FIG. 5B, these circuits are denoted as a logic circuit portion. The second impurity region (B) 209c of the first n-channel TFT 201 becomes a structure which places importance on counteracting hot carriers. In addition, in order to increase voltage resistance and stabilize operation, the TFTs of the logic circuit portion may also be formed by a first p-channel TFT 280 and a first n-channel TFT 281, as shown by FIG. 9A. These TFTs have a double gate structure in which two gate electrodes are formed between one source and drain pair, and this type of TFT can be similarly manufactured by using the processes of Embodiment 1. The structure of the first p-channel TFT 280 has channel forming regions 236a and 236b, third impurity regions 238a, 239a, and 240a which function as source or drain regions, fourth impurity regions (A) 238b, 239b, and 240b which become LDD regions, and fourth impurity regions (B) 238c, 239c, and 240c which become LDD regions overlapping a portion of a gate electrode 237 in the island-like semiconductor layer. The structure of the first n-channel TFT 281 has channel forming regions 241a and 241b, first impurity regions 243a, 244a, and 245a which function as source or drain regions, second impurity regions (A) 243b, 244b, and 245b which become LDD regions, and second impurity regions (B) 243c, 244c, and 245c which become LDD regions overlapping a portion of a gate electrode 242 in the island-like semiconductor layer. Taking the length of the LDD region which overlaps the gate electrode as Lov, its length in the longitudinal direction of the channel is set from 0.1 to 0.3 μm with respect to a channel length of 3 to 7 μm.

Figure 9B:
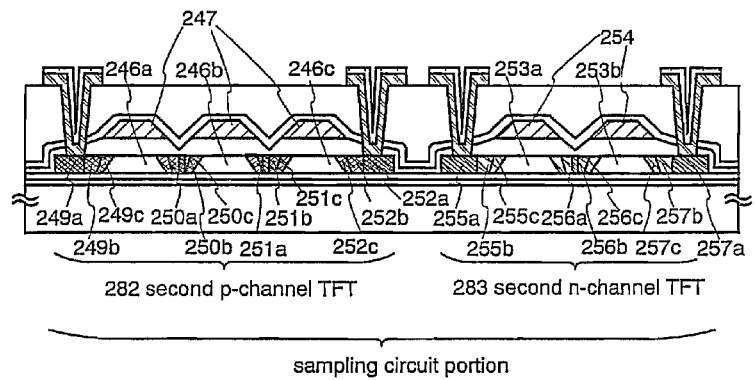

Further, in a sampling circuit structured by analog switches, similarly structured second p-channel TFTs 202 and second n-channel TFTs 203 can be applied. The sampling circuit places importance on measures against hot carriers and low Off current operation therefore the TFT of this circuit may be formed by a second p-channel TFT 282 and a second n-channel TFT 283 as shown by FIG. 9B. The second p-channel TFT 282 has a triple gate structure in which three gate electrodes are formed between one source and drain pair, and this type of TFT can be similarly manufactured by using the processes of Embodiment 1. The structure of the second p-channel TFT 282 has channel forming regions 246a, 246b, and 246c, third impurity regions 249a, 250a, 251a, and 252a which function as source or drain regions, fourth impurity regions (A) 249b, 250b, 251b, and 252b which become LDD regions, and fourth impurity regions (B) 249c, 250c, 251c, and 252c which become LDD regions overlapping a portion of a gate electrode 247. The structure of the second n-channel TFT 283 has channel forming regions 253a and 253b, first impurity regions 255a, 256a, and 257a which function as source or drain regions, second impurity regions (A) 255b, 256b, and 257b which become LDD regions, and second impurity regions (B) 255c, 256c, and 257c which become LDD regions overlapping a portion of a gate electrode 254. Taking the length of the LDD region which overlaps the gate electrode as Lov, its length in the longitudinal direction of the channel is set from 0.1 to 0.3 μm with respect to a channel length of 3 to 7 μm.

Thus, whether to use a single gate structure for the structure of the TFT gate electrode, or to use a multi-gate structure in which a plurality of gate electrodes are formed between one source and drain pair, may be suitably determined by the operator, in accordance with the circuit characteristics. A reflecting type liquid crystal display device can then be manufactured by using the active matrix substrate completed in Embodiment 1.

Embodiment 2

Examples of using heat-resistant conductive materials such as W and Ta as materials for the gate electrode were shown in Embodiment 1. The reason for using these materials resides in that it is necessary to activate the impurity element that was doped into the semiconductor layer for the purpose of controlling the conductive type after the formation of the gate electrode by thermal annealing at between 400° C. and 700° C. By implementing this step, it is necessary that the gate electrode has heat-resistivity. However, this type of heat-resistant conductive material has a sheet resistivity of about 10 W, and hence is not always suitable for a display device having a screen size of a 4-inch class or more. This is because if a gate wiring to be connected to the gate electrode is formed of the same material, then the length of the lead wiring on the substrate inevitably becomes large. Thus, the problem of a wiring delay caused by the influence of wiring resistance cannot be ignored.

For example, 480 gate wirings and 640 source wirings are formed when the pixel density is VGA, and 768 gate wirings and 1024 source wirings are formed in the case of XGA. The screen size of the display region becomes 340 mm for a 13-inch class in diagonal length, and becomes 460 mm for an 18-inch class. In this embodiment, as a means of realizing this kind of liquid crystal display device, a method of forming the gate wiring from low-resistant conductive material such as Al and copper (Cu) will be explained using FIG. 6.

First, similar to Embodiment 1, the steps shown in FIGS. 3(A) to 4(C) will be performed. Then a step of activating the impurity element doped into the respective island semiconductor layers for the purpose of controlling the conductive type is performed. This step is performed by thermal annealing using an annealing furnace. In addition, laser annealing or rapid thermal annealing (RTA) can also be employed. The thermal annealing process is performed at 400° C. to 700° C., typically 500° C. to 600° C. in a nitrogen atmosphere which has an oxygen concentration of 1 ppm or less, preferably 0.1 ppm or less. In this embodiment, heat treatment is performed for 4 hours at 500° C.

Through this heat treatment, conductive layers 140 to 145 having a second tapered shape, come to have conductive layers (C) 172a to 172f formed to a thickness of 5 to 80 nm from the surfaces. For example, when the conductive layers having a second tapered shape are tungsten (W), tungsten nitride (WN) is formed, and tantalum nitride (TaN) is formed when the conductive layers are tantalum (Ta). Further, a step of hydrogenating the island semiconductor layers is performed by heat treatment at 300 to 450° C. for between 1 and 12 hours in an atmosphere containing between 3 and 100% hydrogen. This step is one for terminating dangling bonds in the semiconductor layers with thermally excited hydrogen. Plasma hydrogenation (using hydrogen excited by a plasma) may be performed as another means of hydrogenation. (See FIG. 6A)

After the activation and hydrogenation steps are completed, a gate wiring is formed from a low-resistant conductive material comprising aluminum (Al) or copper (Cu) as a main component. The gate wiring is formed from the low-resistant conductive layer comprising such a material. For example, an aluminum film containing between 0.1 and 2% by weight of titanium (Ti) is formed as the low-resistant conductive layer on the entire surface (not shown). The low-resistant conductive layer may be formed with a thickness of 200 to 400 nm (preferably 250 to 350 nm). Then, a predetermined resist pattern is formed, the conductive layer is etched in order to form gate wirings 173 and 174. At this time, a capacitor wiring 175 which is connected with a storage capacitor provided in a pixel portion, is formed from the same material. When the low-resistant conductive layer comprises aluminum (Al) as a main component, by wet etching using a phosphoric acid-based etching solution, the gate wiring can be formed while maintaining the selective workability with the base. A first interlayer insulating film 176 is formed in the same way as that of Embodiment 1. (See FIG. 6B)

Figure 7A:
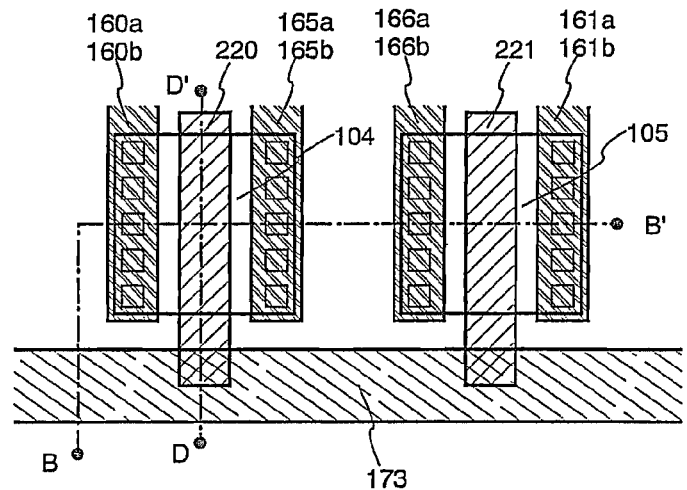
FIGS. 7A and 7B are top views showing the structure of a driver circuit TFT and the structure of a pixel TFT.
Figure 7B:
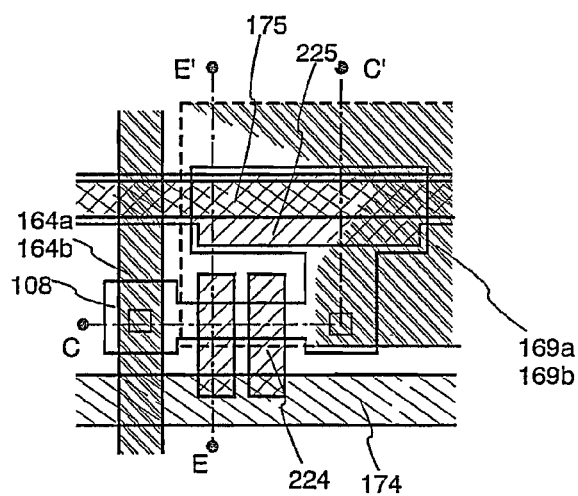
Figure 8A:
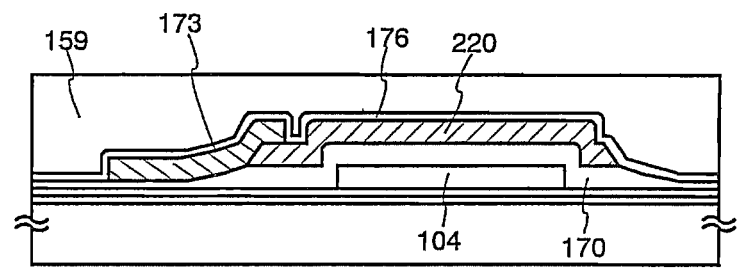
FIGS. 8A and 8B are cross sectional diagrams showing the structure of a driver circuit TFT and the structure of a pixel TFT.
Figure 8B:
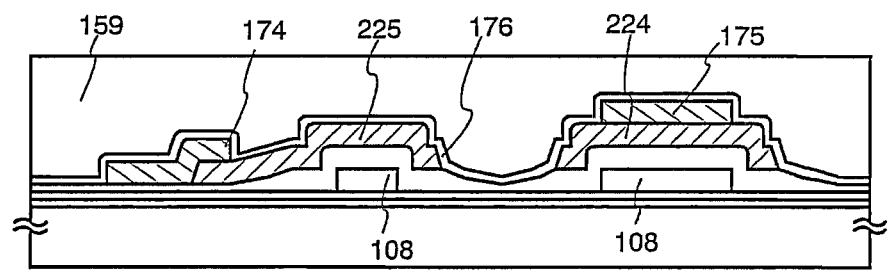

Thereafter, similar to Embodiment 1, by forming the second interlayer insulating film 159 made of an organic insulating material, source wirings 160 to 164, and drain wirings 165 to 168, pixel electrodes 169 and 171, the active matrix substrate can thus be completed. FIGS. 7(A) and 7(B) show top views of this state, and the cross sections taken along the line B-B' of FIG. 7A and the line C-C' of FIG. 7B correspond to the B-B' and C-C' cross sections, respectively, in FIG. 5C. Although the gate insulating film, the first interlayer insulating film, and the second interlayer insulating film are omitted from the FIGS. 7(A) and 7(B), the source and drain regions of the island semiconductor layers 104, 105, and 108 not shown in the figure are connected to the source wirings 160, 161 and 164, and drain wirings 165, 166 and the pixel electrode 169 through contact holes. Further, the cross sections taken along the line D-D' of FIG. 7A and the line E-E' of FIG. 7B are shown in FIGS. 8A and 8B, respectively. The gate wiring 173 is formed overlapping the gate electrodes 220, and the gate wiring 174 is formed overlapping the gate electrode 225 in the outside of the island semiconductor layers 104 and 108. Thus, the gate electrode and the low-resistant conductive layer are in close contact to be electrically communicated without contact holes. By forming the gate wiring from a low-resistant conductive material in this way, the wiring resistance can be sufficiently reduced. Accordingly, the present invention can be applied to a display device that has a pixel portion (screen size) of 4-inch class or more.

Embodiment 3

The active matrix substrate manufactured in Embodiment 1 is applicable for a reflection type display device as it is. On the other hand, in the case of applying it to a transmission type liquid crystal display device, it is appropriate to form the pixel electrodes provided in each pixel of the pixel portion with transparent electrodes. A method of manufacturing an active matrix substrate corresponding to the transmission type liquid crystal display device is explained in Embodiment 3 with references to FIG. 10.

Figure 10A:
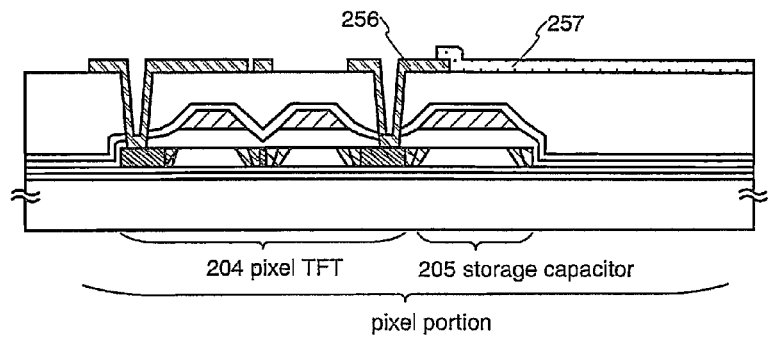
FIGS. 10A to 10D are cross sectional diagrams showing the structure of a pixel TFT.
Figure 10B:
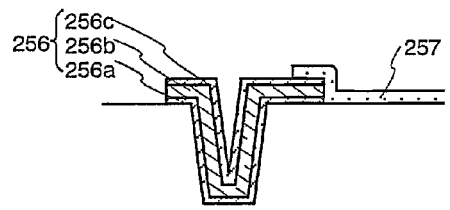

The active matrix substrate is manufactured in the same way as Embodiment 1. In FIG. 10A, a conductive metallic film is formed by sputtering or vacuum evaporation to form a source wiring and a drain wiring. This structure will be explained in detail with reference to FIG. 10B using the drain wiring 256 as an example. A Ti film 256a is formed at a thickness of between 50 and 150 nm, and then a contact is formed with a semiconductor film that forms the source or the drain region in an island semiconductor layer. Next an aluminum (Al) film 256b is formed at a thickness of between 300 and 400 nm overlapping on the Ti film 256a. Further, a Ti film 256c or a titanium nitride (TiN) film is formed at a thickness of between 100 and 200 nm to thereby form a three-layer structure. Then a transparent conductive film is formed on the entire surface. A pixel electrode 257 is formed by a patterning process and an etching process, using a photomask. The pixel electrode 257 is formed on a second interlayer insulating film made of an organic resin material and sets aside a portion for overlapping with the drain wiring 256 of the pixel TFT 204 without contact holes in order to form an electrical connection.

Figure 10C:
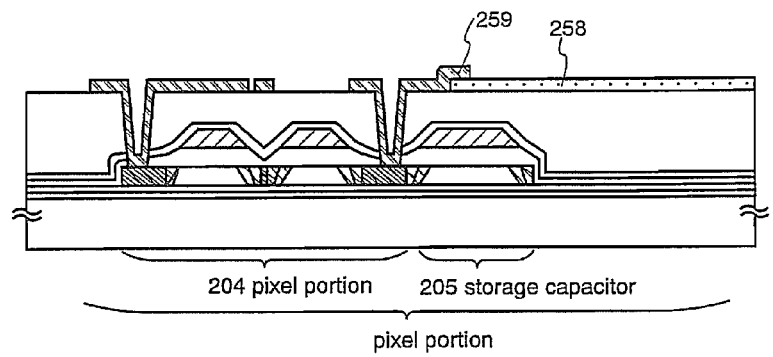
Figure 10D:
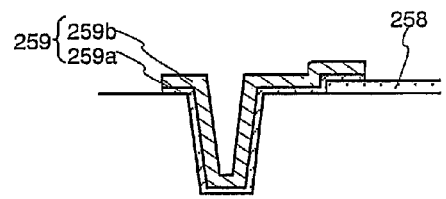

FIG. 10C is an example of first forming a transparent conductive film on the second interlayer insulating film, performing a patterning process and an etching process to form a pixel electrode 258, and then forming a drain wiring 259 by a portion that overlaps with the pixel electrode 258 without contact holes. As shown in FIG. 10D, the drain wiring 259 is provided by forming a Ti film 259a at a thickness of between 50 and 150 nm, forming a contact hole with a semiconductor film that forms the source or the drain region in an island semiconductor layer, and then forming an aluminum film 259b at a thickness of between 300 and 400 nm overlapping on the Ti film 259a. With this structure, the pixel electrode 258 is in contact only with the Ti film 259a that forms the drain wiring 259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$; ITO) formed by sputtering or vacuum evaporation may be used as materials for the transparent conductive film. The etching treatment of these materials is performed with hydrochloric acid solutions. However, in particular, the etching of ITO readily generates residues. Therefore, an indium oxide/zinc oxide alloy ($In_2O_3$—$ZnO$) may be used in order to improve the etching workability. The indium oxide/zinc oxide alloy has excellent flat and smooth surface properties, and also has excellent thermal stability with regard to ITO. Accordingly, in the structure of FIGS. 20(A) and 20(B), at an edge surface of a drain wiring 256 where the Al film 256b comes into contact with the pixel electrode 257, corrosion reaction with Al can be prevented. Similarly, zinc oxide (ZnO) is also a suitable material. In order to further improve the transmissivity of visible light and conductivity, zinc oxide (ZnO:Ga) doped with gallium (Ga) or the like may be used.

In Embodiment 1, an active matrix substrate that can be used for manufacturing the reflection type liquid crystal display device was fabricated by using 5 photomasks. The addition of one more photomask (a total of 6 photomasks) can thus complete an active matrix substrate corresponding to the transmission type liquid crystal display device. Though the steps of described in this embodiment are similar to those in Embodiment 1, this kind of structure can be applied to the active matrix substrate shown in Embodiment 2.

Embodiment 4

Another method of manufacturing a crystalline semiconductor layer that forms an active layer of a TFT of the active matrix substrate indicated in Embodiment 1 to Embodiment 3 is shown here in Embodiment 4. A crystalline semiconductor layer is formed by crystallizing an amorphous semiconductor layer by thermal annealing, laser annealing, or rapid thermal annealing (RTA) or the like. Another crystallization method disclosed in Japanese Patent Application Laid-open No. Hei 7-130652 in which a catalyst element is used can also be applied. An example of this case is explained with references to FIG. 12.

As shown in FIG. 12A, base films 1102a and 1102b and a semiconductor layer 1103 having an amorphous structure formed at a thickness of between 25 to 80 nm are formed over a glass substrate 1101, similar to Embodiment 1. An amorphous silicon (a-Si) film, an amorphous silicon germanium (a-SiGe) film, an amorphous silicon carbide (a-SiC) film, an amorphous silicon tin (a-SiSn) film, etc. are applicable for the amorphous semiconductor layer. It is appropriate to form these amorphous semiconductor layers to contain hydrogen at about 0.1 to 40 atomic %. For example, an amorphous silicon film is formed at a thickness of 55 nm. An aqueous solution containing 10 ppm by weight conversion of a catalyst element is then applied by spin coating in which application is performed by rotating the substrate with a spinner, forming a layer 1104 containing the catalyst element. Catalyst elements include nickel (Ni), germanium (Ge), iron (Fe), palladium (Pd), tin (Sn), lead (Pb), cobalt (Co), platinum (Pt), copper (Cu), gold (Au), and the like. Other than spin coating, the catalyst element containing layer 1104 may also be made by forming a 1 to 5 nm thick layer of the above catalyst elements by printing, a spraying method, and the bar coater method, or sputtering or vacuum evaporation.

In the crystallization step shown in FIG. 12B, heat treatment is first performed for approximately 1 hour at between 400° C. and 500° C., making the amount of hydrogen contained in the amorphous silicon film 5 atomic % or less. If the initial amount of hydrogen contained in the amorphous silicon film is this value after film deposition, the heat treatment need not be performed. Thermal annealing is then performed in a nitrogen atmosphere at 550° C. to 600° C. for between 1 and 8 hours using an annealing furnace. A crystalline semiconductor layer 1105 made from the crystalline silicon film can thus be obtained through the above steps (See FIG. 12C). However, if the crystalline semiconductor layer 1105 manufactured by this thermal annealing, is observed microscopically using an optical microscope, it is observed that amorphous region remains locally. In this case, from observation of spectrum using a Raman spectroscopy, an amorphous constituent observed at 480 cm$^{-1}$ has a broad peak. Therefore, after thermal annealing, treating the crystalline semiconductor layer 1105 with the laser annealing method explained in Embodiment 1 is an effective means applicable for enhancing the crystallinity of the crystalline semiconductor film.

Figure 17:
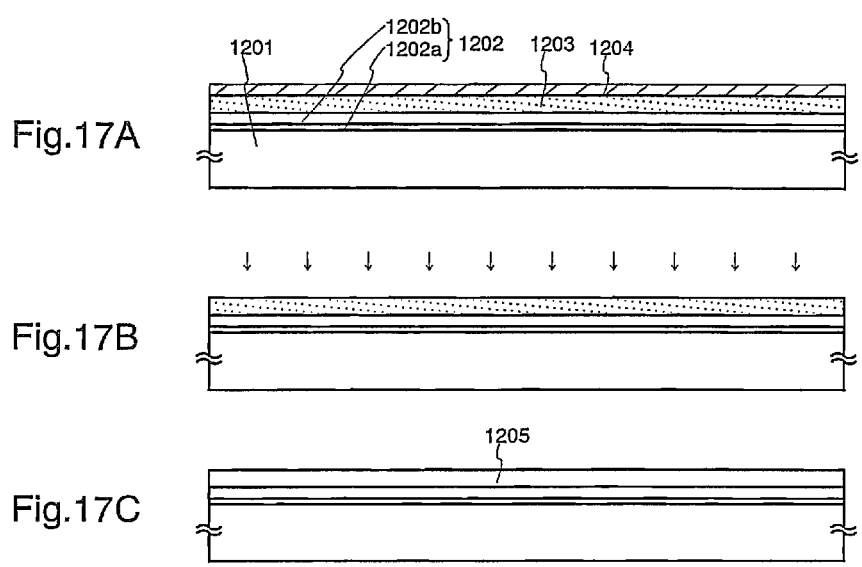
FIGS. 17A to 17C are cross sectional diagrams showing a process of manufacturing a crystalline semiconductor layer.

Similarly, FIG. 17 also shows an example of a crystallization method using a catalyst element in which a layer containing a catalyst element is formed by sputtering. First, base films 1202a and 1202b and a semiconductor layer 1203 having an amorphous structure formed at a thickness of between 25 to 80 nm are formed over a glass substrate 1201, similar to Embodiment 1. Then about a 0.5 to 5 nm thick oxide film is formed on the surface of the semiconductor layer 1203 having an amorphous structure (not shown in the Figure). As an oxide film having such thickness, an appropriate coating may be actively formed by plasma CVD or sputtering, but the oxide film may also be formed by exposing the surface of the semiconductor layer 1203 having an amorphous structure to an oxygen atmosphere in which the substrate has been heated at 100° C. to 300° C. and plasma treated, or exposing the surface of the semiconductor layer 1203 having an amorphous structure to a solution containing hydrogen peroxide ($H_2O_2$). The oxide film may also be formed by irradiating ultraviolet light into an atmosphere containing oxygen to generate ozone and then exposing the semiconductor layer 1203 having an amorphous structure to the ozone atmosphere.

In this way, a layer 1204 containing the above catalyst element is formed by sputtering, on the semiconductor layer 1203 having an amorphous structure with a thin oxide film on its surface. No limitations are placed on the thickness of this layer, but it is appropriate to form this layer at about 10 to 100 nm. For example, an effective method is to form a Ni film with Ni as the target. In sputtering, a part of a high-energy particle made from the above catalyst element accelerated in the electric field also comes flying to the substrate side and is driven into the close vicinity of the surface of the semiconductor layer 1203 having an amorphous structure or into the oxide film which is formed on the surface of the semiconductor layer. This proportion differs depending on conditions of generating plasma or the bias state of the substrate. However, it is appropriate to set the amount of catalyst element to be driven into the close vicinity of the surface of the semiconductor layer 1203 having an amorphous structure and within the oxide film to fall approximately between $1\times10^{11}$ and $1\times10^{14}$ atoms/cm$^2$.

Then the layer 1204 containing a catalyst element is selectively removed. For example, if this layer is formed from the Ni film, it is possible to remove this layer by a solution such as nitric acid, or if an aqueous solution containing fluoric acid is used, not only the Ni film but also the oxide film formed on the semiconductor layer 1203 having an amorphous structure can be removed at the same time. Whichever is used, the amount of catalyst element in the close vicinity of the surface of the semiconductor layer 1203 having an amorphous structure should be approximately between $1\times10^{11}$ and $1\times10^{14}$ atoms/cm$^2$. As shown in FIG. 17B, the crystallization step is performed by thermal annealing, similarly to FIG. 12B, and a crystalline semiconductor layer 1205 can thus be obtained (See FIG. 17C)

Figure 12:
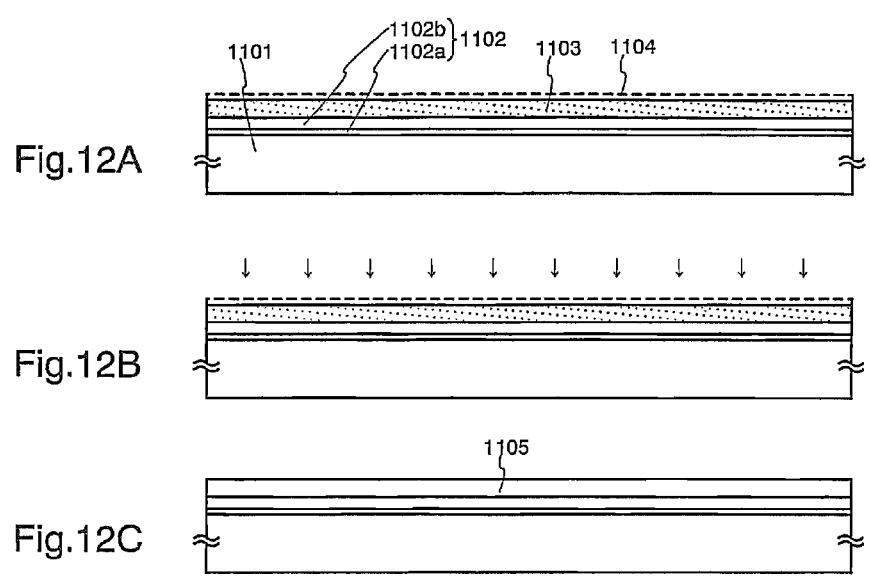
FIGS. 12A to 12C are cross sectional diagrams showing a process of manufacturing a crystalline semiconductor layer.

By forming the island semiconductor layers 104 to 108 from the crystalline semiconductor layers 1105 and 1205 manufactured in FIG. 12 or FIG. 17, an active matrix substrate can be completed, similarly to Embodiment 1. However, in crystallization process, if a catalyst element for promoting the crystallization of silicon is used, a small amount (about $1\times10^{17}$ to $1\times10^{19}$ atoms/cm$^3$) of the catalyst element remains within the island semiconductor layers. It is, of course, possible to complete the TFT in such a state, but it is preferred to remove the remaining catalyst element from at least the channel forming region. One of the means of removing this catalyst element is a means using gettering action of phosphorous (P).

Figure 13:
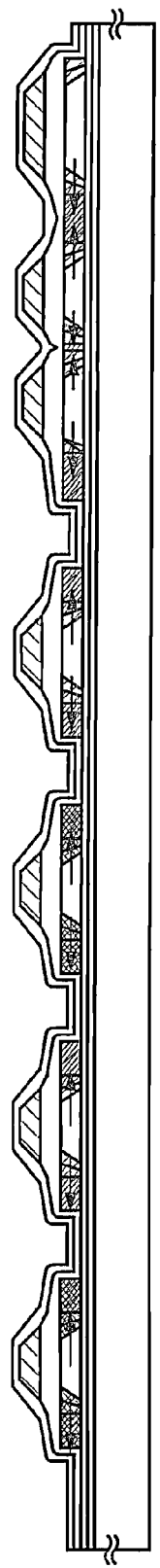
FIG. 13 is a cross sectional diagram showing a process of manufacturing a pixel TFT and a driver circuit TFT.

The gettering treatment with phosphorous used in this purpose may be performed together with the activation step explained in FIG. 5A. This state is explained with reference to FIG. 13. The concentration of phosphorous (P) necessary for gettering may be on a similar order as the impurity concentration of the high concentration n-type impurity regions, and the catalyst element can be segregated at this concentration from the channel forming regions of the n-channel TFT and the p-channel TFT, into the phosphorous (P) contained impurity regions, by the thermal annealing at the activation step. (direction of an arrow in FIG. 13) As a result, the catalyst element is segregated into the impurity regions at a concentration of about $1\times10^{17}$ to $1\times10^{19}$ atoms/cm$^3$. A TFT with good characteristics can be attained because the Off current value of a TFT manufactured in this way is reduced, and high electric field mobility is attained due to good crystallinity. The structure of Embodiment 4 can be combined with Embodiment 1 to 3.

Embodiment 5

Figure 14A:
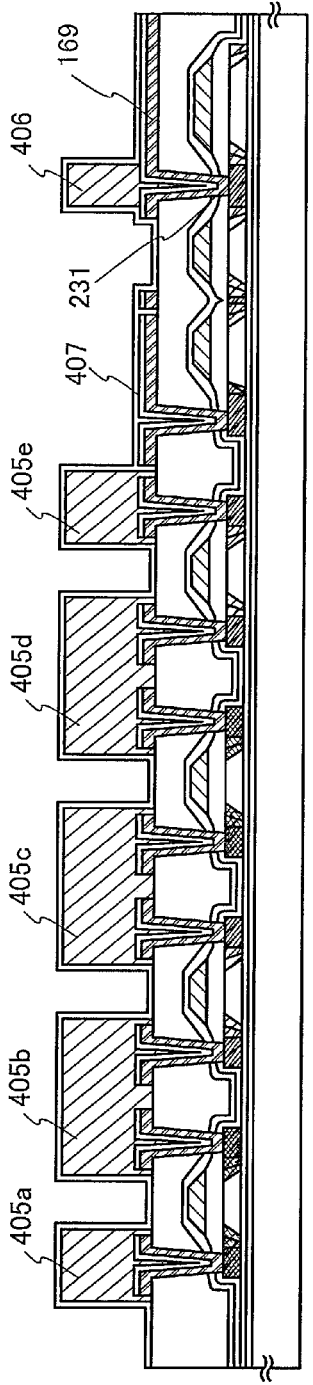
FIGS. 14A and 14B are cross sectional diagrams showing a process of manufacturing an active matrix type liquid crystal display device.

A process of manufacturing an active matrix liquid crystal display device from the active matrix substrate fabricated in Embodiment 1 will be explained here in this Embodiment. As shown in FIG. 14A, first a spacer made from a column-shape spacer is formed on the active matrix substrate in the state of FIG. 5B. The spacer may be provided by a method of spraying several mm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. The spacer is formed so that its shape becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height is set between 1.2 and 5 mm, the average radius is set between 5 and 7 mm, and the ratio of the average radius and the radius of the bottom portion is set to 1 to 1.5. The taper angle of the side surface at this point is ±15° or less.

The arrangement of the spacers may be arbitrarily determined, but preferably it is appropriate to form a column-shape spacer 406 overlapping the contact area 231 of the pixel electrode 169 in the pixel portion so as to cover that overlapped portion as shown in FIG. 14A. Liquid crystal cannot be smoothly oriented in a portion where the levelness of the contact area 231 has been ruined. Hence, the column-shape spacer 406 is formed as in the form of filling the contact area 231 with resin used for the spacer, whereby disclination or the like can be prevented. In addition, spacers 405a to 405e are formed on the TFT of the driver circuit. These spacers may be formed extending over the entire surface of the driver circuit portion, and may also be formed so as to cover the source wiring and the drain wiring as shown in FIG. 14A.

Thereafter, an alignment film 407 is formed. A polyimide resin is generally used for the alignment film of a liquid crystal display device. After forming the alignment films, a rubbing treatment is performed so that the liquid crystal molecules are oriented with a certain fixed pre-tilt angle. The rubbing treatment is performed so that an area of 2 mm or less from the edge portion of the column-shape spacer 406 provided in the pixel portion to the rubbing direction, is not rubbed. Further, since the generation of static electricity from the rubbing treatment is often a problem, an effect of protecting the TFT from the static electricity can be attained by forming the spacers 405a to 405e formed on the TFT of the driver circuit. Although not described in the figures, the substrate may have a structure in which the alignment film 407 is formed before forming the spacers 406 and 405a to 405e.

A light shielding film 402, a transparent conductive film 403, and an alignment film 404 are formed on an opposing substrate 401, which is opposed to the active matrix substrate. The light shielding film 402 is formed of films such as a Ti film, a Cr film, and an Al film at a thickness of between 150 and 300 nm. Then, the active matrix substrate on which the pixel portion and the driver circuit are formed, and the opposing substrate are then joined together by a sealant 408. A filler (not shown in the figures) is mixed into the sealant 408, and the two substrates are joined together with a uniform spacing by the filler and the spacers 406 and 405a to 405e. Next, a liquid crystal material 409 is injected between both substrates. A known liquid crystal material may be used as the liquid crystal material. For example, besides the TN liquid crystal, a thresholdness antiferroelectric mixed liquid crystal that indicates electro-optical response characteristics of continuously changing transmittance with respect to an electric field may also be used. Among such thresholdness antiferroelectric mixture liquid crystal, there is a type that indicates a V-shaped electro-optical response characteristic. In this way, the active matrix type liquid crystal display device shown in FIG. 14B is completed.

Figure 15:
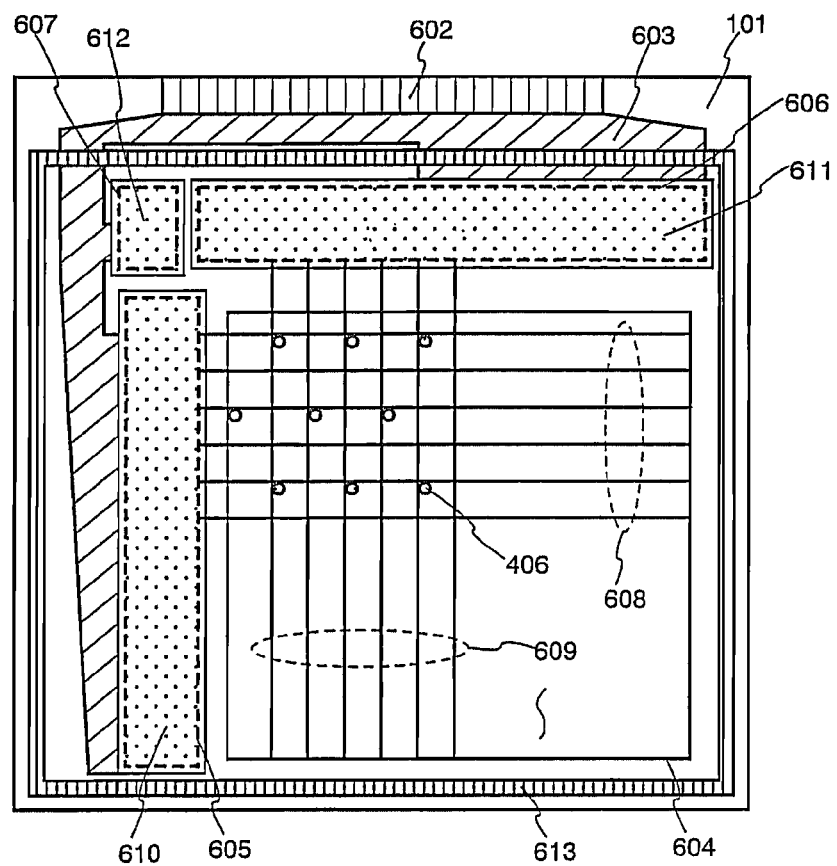
FIG. 15 is a top view for explaining an input-output terminal, a wiring, a circuit arrangement, a spacer, and a sealing material arrangement of a liquid crystal display device.

FIG. 15 is a top view showing this type of active matrix substrate and the positional relation of the pixel portion and the driver circuit portion versus the spacers and the sealant. A scanning signal driver circuit 605 and an image signal driver circuit 606 as driver circuits are provided in the periphery of a pixel portion 604 on the glass substrate 101 described in Embodiment 1. In addition, a signal processing circuit 607 such as a CPU or a memory circuit may also be added. Then these driver circuits are connected to an external input/output terminal 602 by a connecting wiring 603. In the pixel portion 604, a set of gate wirings 608 extending from the scanning signal driver circuit 605 and a set of source wirings 609 extending from the image signal driver circuit 606 intersect in matrix to form pixels. Each pixel is provided with the pixel TFT 204 and the storage capacitor 205.

Figure 14B:
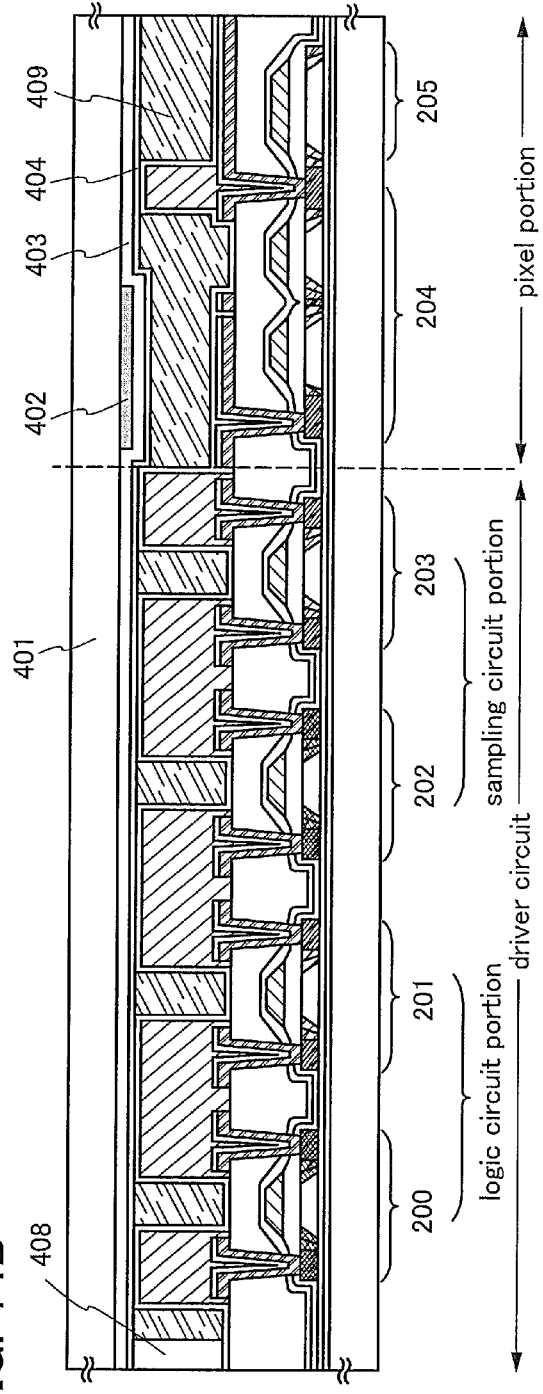

The column-shape spacer 406 provided in the pixel portion may be provided not only to every pixel as shown in FIGS. 14A and 14B, but also to every several pixels or several tens of the pixels arranged in a matrix manner as shown in FIG. 15. In other words, it is possible to set the ratio of the total number of pixels composing the pixel portion to the number of spacers between 20% and 100%. In addition, the spacers 405a to 405e provided in the driver circuits portion may be formed so as to cover the entire surface of the circuits, or may be provided in accordance with the position of the source wiring and the drain wiring of each TFT. In FIG. 15, reference numerals 610 to 612 denote the arrangement of the spacers provided in the driver circuit portion. In FIG. 15, the sealant 619 is formed on the exterior of the pixel portion 604, the scanning signal driver circuit 605, the image signal driver circuit 606, and the signal processing circuit 607 of the other circuits, and on the interior of an external input/output terminal 602, that are formed over the substrate 101.

Figure 16:
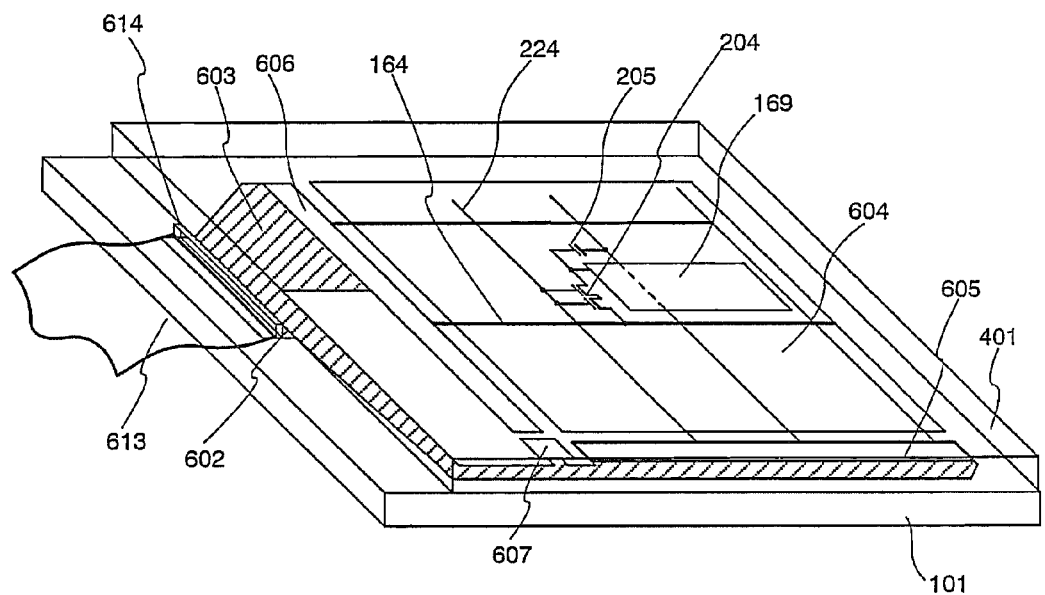
FIG. 16 is a perspective view showing a structure of a liquid crystal display device.

Next, the structure of this kind of active matrix liquid crystal display device is explained using the perspective view of FIG. 16. In FIG. 16, the active matrix substrate comprises the pixel portion 604, the scanning signal driver circuit 605, the image signal driver circuit 606, and the signal processing circuit 607 of the other circuits formed over the glass substrate 101. The pixel TFT 204 and the storage capacitor 205 are provided in the pixel portion 604, and the driver circuit formed in the periphery thereof is structured based on a CMOS circuit. The scanning signal driver circuit 605 and the image signal driver circuit 606 are connected to the pixel TFT 204 by the gate wiring (which is equal to 224 in FIG. 5B when the gate wiring is formed subsequent to the gate electrode) and the source wiring 164, respectively, extending to the pixel portion 604. Further, an FPC (flexible printed circuit) 613 is connected to the external input terminal 602 to be utilized for inputting signals such as image signals. The FPC 613 is firmly adhered in this area by a strengthening resin 614. The connecting wiring 603 is connected to the respective driver circuits. Further, though not shown in the figure, a light shielding film and a transparent electrode are provided on the opposing substrate 401.

A liquid display device with this kind of structure can be formed by using the active matrix substrate described in Embodiments 1 to 3. The reflection type liquid crystal display device can be attained with employment of the active matrix substrate shown in Embodiment 1 whereas the transmission type liquid crystal display device can be attained with employment of the active matrix substrate shown in Embodiment 3.

Embodiment 6

Figure 18:
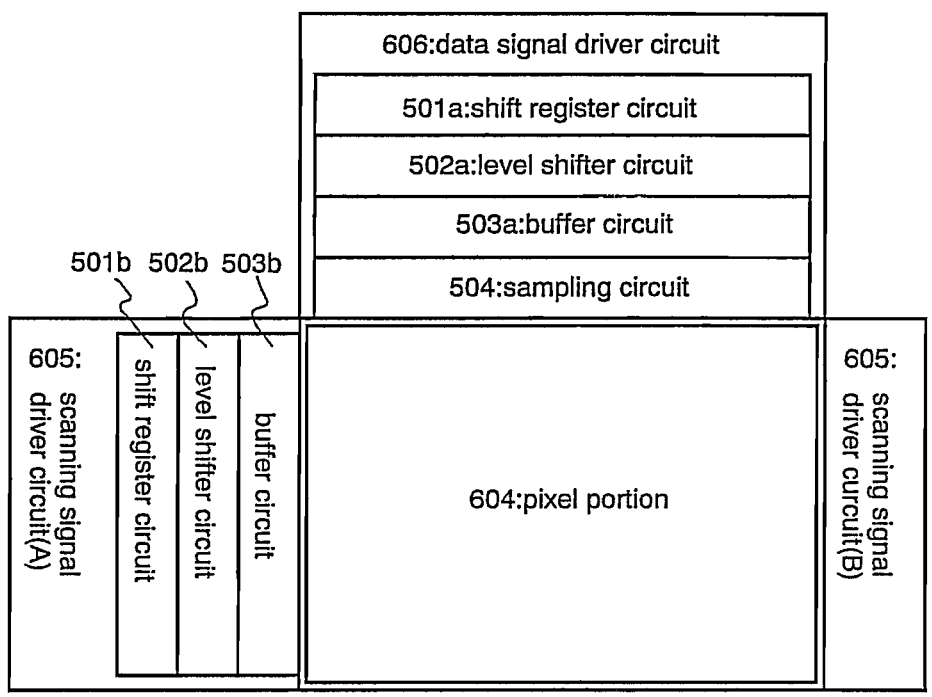
FIG. 18 is a block diagram for explaining a circuit structure of an active matrix type display device.

FIG. 18 illustrates an example of the circuit structure of the active matrix substrate described in Embodiments 1 to 3, and shows the circuit structure of a direct-view type display device. This active matrix substrate is composed of the image signal driver circuit 606, the scanning signal driver circuits (A) and (B) 605, and the pixel portion 604. Note that the driver circuit stated throughout the present specification is a generic term including the image signal driver circuit 606 and the scanning signal driver circuits 605.

The image signal driver circuit 606 comprises a shift register circuit 501a, a level shifter circuit 502a, a buffer circuit 503a, and a sampling circuit 504. In addition, the scanning signal driver circuits (A) and (B) 185 comprises a shift register circuit 501b, a level shifter circuit 502b, and a buffer circuit 503b.

The driving voltages of the shift register circuits 501a and 501b are between 5 and 16V (typically 10V). A TFT of a CMOS circuit for forming this circuit is formed of the first p-channel TFT 200 and the first n-channel TFT 201 of FIG. 5B, or the TFT may be formed of the first p-channel TFT 280 and the first n-channel TFT 281 shown in FIG. 9A. In addition, since the driving voltage of the level shifter circuits 502a and 502b and the buffer circuits 503a and 503b become as high as 14 to 16V, it is preferable that the TFT structure be formed into a multi-gate structure as shown in FIG. 9A. Forming the TFT into a multi-gate structure is effective in raising voltage-resistance and improving the reliability of the circuits.

The sampling circuit 504 comprises an analog switch and its driving voltage is between 14 to 16V. Since the polarity alternately reverses to be driven and there is a necessity to reduce the Off current value, it is desired that the sampling circuit 504 be formed of the second p-channel TFT 202 and the second n-channel TFT 203 as shown in FIG. 5B. Alternatively, the sampling circuit may be formed of the second p-channel TFT 282 and the second n-channel TFT 283 of FIG. 9B in order to effectively reduce the Off current value.

Further, the driving voltage of the pixel portion is between 14 and 16V. From a viewpoint of reducing power consumption, there is a demand to further reduce the Off current value than that of the sampling circuit. Accordingly, as a basic structure, the pixel portion is formed into a multi-gate structure as the pixel TFT 204 shown in FIG. 5B.

Note that the structure of this Embodiment can be readily realized by manufacturing the TFT in accordance with the steps shown in Embodiments 1 through 3. The structures of the pixel portion and the driver circuits only are shown in this embodiment. Other circuits such as a signal divider circuit, a frequency dividing circuit, a D/A converter, a γ correction circuit, an op-amp circuit, and further signal processing circuits such as a memory circuit and a processing circuit, and still further a logic circuit, may all be formed on the same substrate in accordance with the processes of Embodiments 1 through 3. In this way, the present invention can realize a semiconductor device comprising a pixel portion and a driver circuit thereof on the same substrate, for example, a liquid crystal display device equipped with a signal controlling circuit and a pixel portion.

Embodiment 7

Figure 19A:
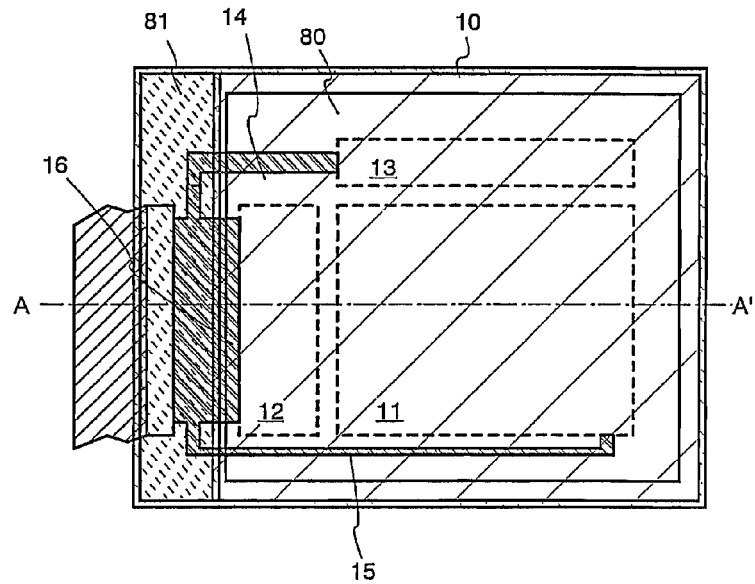
FIGS. 19A and 19B are a top view and a cross sectional diagram, respectively, showing a structure of an EL display device.

In this embodiment, an example will be described where a display panel made from an EL (Electro Luminescence) material in a self-emitting type (hereinafter described as EL display device) is formed using an active matrix substrate according to the Embodiment 5. FIG. 19A is a top view of an EL display panel using the present invention. In FIG. 19A, reference numeral 10 denotes a substrate, 11 denotes a pixel portion, 12 denotes a source-side driver circuit, and 13 denotes a gate-side driver circuit. Each driver circuit is connected to an FPC 17 through wirings 14 to 16 so as to be connected to external equipment.

Figure 19B:
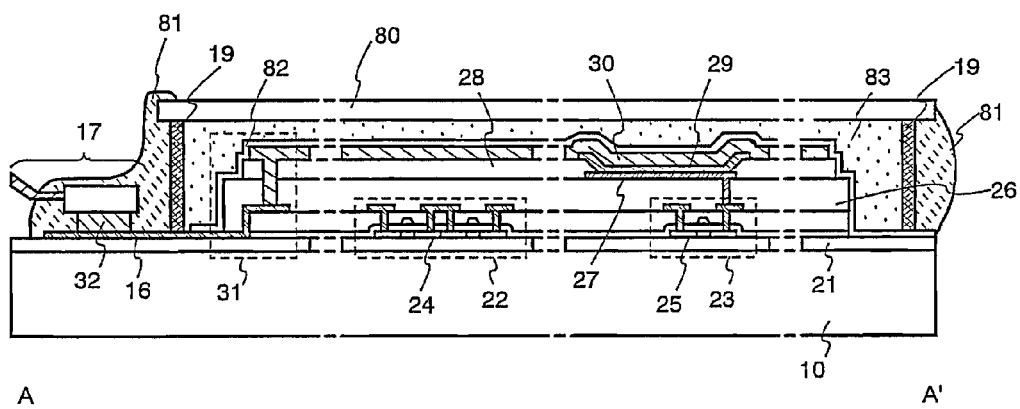

The FIG. 19B shows a sectional structure of A-A□ of FIG. 19A. The counter substrate 80 is provided so as to cover at least surface of the pixel portion, preferably the driver circuits and the surface of the pixel portion. The counter substrate 80 is attached to the active matrix substrate, on which TFTs and EL layer are formed with a sealant 19. The sealant 19 is mixed with a filler (not shown in the figure), two substrate are attached together with the filler at equal spaces. Further, the outside of the sealant 19 and the top surface and the periphery portion of FPC 17 has a structure of being filled up by the sealant 81. As materials of the sealant 81, silicone resin, epoxy resin, phenol resin and butyl rubber are used.

As it is, the active matrix substrate 10 and the counter substrate 80 are attached together with a sealant 19, space is generated therebetween. A filler 83 is filled with the space. The filler 83 has an effect of attachment of the counter substrate 80. The PVC (polyvinyl chloride), epoxy resin, silicone resin, PVB (polyvinyl butyral), and EVA (ethylene vinyl acetate) can be used as the filler 83. An EL layer is weak to moisture such as water and is likely to be degraded, so that it is preferable to mix a drying agent such as barium oxide in the filler 83 so as to keep an effect of moisture absorption. Further, a passivation film 82 is formed on the EL layer by the silicon nitride film and silicon oxynitride film to protect from corrosion by alkali element which contains in the filler 83.

A glass plate, an aluminum plate, a stainless steel plate, an FRP (fiberglass-reinforced plastics) plate, a PVF (polyvinyl fluoride) film, a Mylar film (a product of DUPONT Corp.), a polyester film, and an acrylic film or acrylic plate can be used as the counter substrate 80. A sheet having a structure in which several ten mm thick aluminum foil is interposed between a PVF film and a Mylar film, is used to enhance resistance to moisture. In this manner, the EL element is completely sealed and is not exposed to the outside of air.

In FIG. 19B, the TFT 22 for a driving circuit (CMOS circuit which is composed of n-channel type TFT and p-channel type TFT is shown here), and the TFT 23 for a pixel portion (only TFT controlling current to an EL element is shown here) are formed on a substrate 10 and a base film 21. Among these TFTs, in particular, n-channel TFT is provided with an LDD region having the structure shown in the present embodiment so as to prevent the decrease of the n current value due to hot carrier, or the deterioration of the properties caused by Vth shift and bias stress.

For example, as the TFT 22 for a driver circuit, the p-channel TFT 200, 202 or the n-channel TFT 201, 203 shown in FIG. 5B may be used. Furthermore, as the TFT 23 for a pixel portion, a pixel TFT 204 shown in FIG. 5B or a p-channel TFT having a similar structure can be used.

To manufacture the EL display device from an active matrix substrate in a state of FIG. 5B or FIG. 6B, an interlayer insulating film (a flatten film) 26 made of resin material, is formed on the source line and the drain line, and a pixel electrode 27 made of a transparent conductive film, which is connected electrically to drain of the TFT 23 for a pixel portion, is formed thereon. As a transparent conductive film, a compound of indium oxide and tin oxide (which is called as ITO), and a compound of indium oxide and zinc oxide can be used. Then after forming the pixel electrode 27, an insulating film 28 is formed, and an opening portion is formed on the pixel electrode 27.

Next, an EL layer 29 is formed. The EL layer 29 can have a lamination structure including an appropriate combination of layers made of known EL materials (hole injection layer, hole transporting layer, light-emitting layer, electron transportation layer, or electron injection layer) or a single structure. Such a structure can be obtained by a known technique. Furthermore, examples of the EL material include a low molecular-weight material and polymer material. In the case of using a low molecular-weight material, vapor deposition is used. In the case of using a polymer material, a simple method such as spin coating, printing, and an ink jet method can be used.

In this embodiment, the EL layer is formed by vapor deposition, ink jet method or dispenser method using a shadow mask. By forming light-emitting layers (red light-emitting layer, green-light emitting layer, and blue light-emitting layer) capable of emitting light with different wavelengths on respective pixels, a color display can be performed. In addition, a combination of a color conversion layer (CCM) and a color filter, or a combination of a white light-emitting layer and a color filter may be used. Needless to say, an EL display device emitting single color light can also be used.

When the EL layer 29 is formed, a cathode 30 is formed thereon. It is desirable to remove moisture and oxygen present at an interface between the cathode 30 and the EL layer 29 as much as possible. Thus, it is required to continuously form the EL layer 29 and the cathode 30 in a vacuum, or to form the EL layer 29 in an inactive atmosphere, and form the cathode 30 in a vacuum without exposing the EL layer 29 to the outside air. In this embodiment, a film formation device of a multi-chamber system (cluster tool system) is used to make the above mentioned film formation possible.

In this embodiment, as the cathode 30, a lamination structure of a LiF (lithium fluoride) film and an Al (aluminum) film is used. More specifically, the LiF film is formed to a thickness of 1 nm on the EL layer 29 by vapor deposition, and an Al film is formed to a thickness of 300 nm thereon. It is appreciated that a MgAg electrode that is a known negative electrode material may be used. The cathode 30 is connected to the wiring 16 in a region denoted by reference numeral 31. The wiring 16 is a power supply line for supplying a predetermined voltage to the cathode 30, and is connected to the FPC 17 via anisotropic conductive paste material 32. A resin layer 80 is further formed on the FPC 17 so as to enhance adhesiveness in this portion.

In order to electrically connect the cathode 30 to the wiring 16 in the region 31, it is required to form contact holes in the interlayer insulating film 26 and the insulating film 28. The contact holes may be formed during etching of the interlayer insulating film 26 (during formation of a contact hole for a pixel electrode) or during etching of the insulating film 28 (during formation of an opening portion before forming the EL layer). Furthermore, when the insulating film 28 is etched, the interlayer insulating film 26 may also be etched together. In this case, if the interlayer insulating film 26 and the insulating film 28 are made of the same resin material, the shape of the contact holes can be made fine.

Furthermore, the wiring 16 is electrically connected to the FPC 17 through a gap between the sealant 19 and the substrate 10 (the gap is filled with a sealant 81). Herein, although description is made with respect to the wiring 16, the other wirings 14 and 15 are also electrically connected to the FPC 17 through a gap between the sealant 81.

Figure 21A:
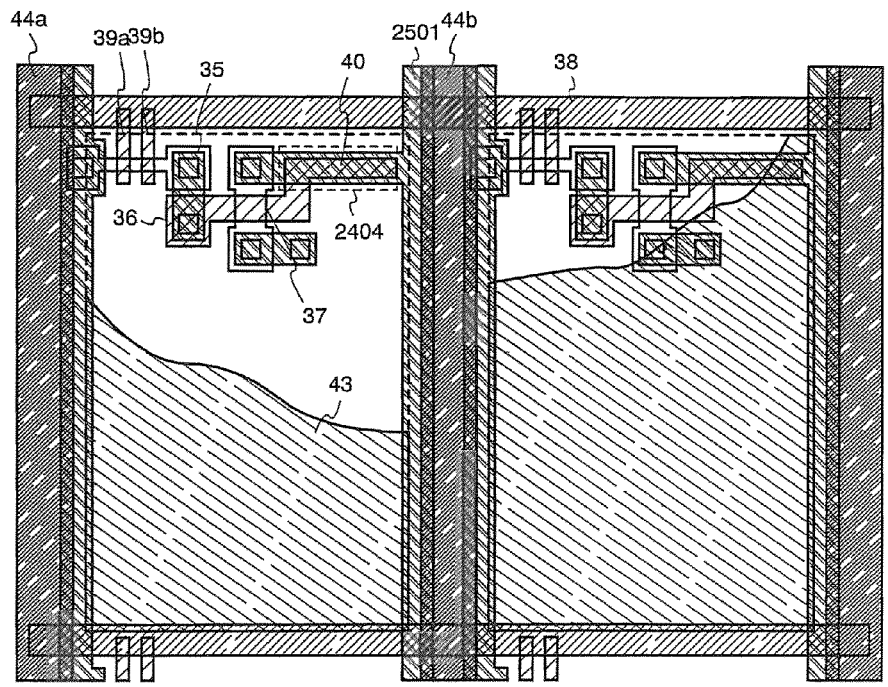
FIGS. 21A and 21B are a top view and a circuit diagram, respectively, of a pixel portion of an EL display device.
Figure 21B:
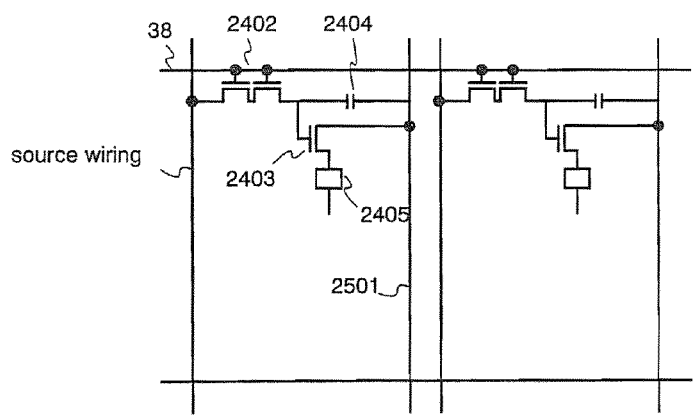

FIG. 20 shows a more detailed cross-sectional structure of the pixel portion. FIG. 21A shows a top view thereof; and FIG. 21B shows a circuit diagram thereof. In FIG. 20A, a switching TFT 2402 provided on a substrate 2401 is formed according to the same structure of the pixel TFT 204 shown in FIG. 5B of Embodiment 1. Due to the double-gate structure, there is an advantage in that substantially two TFTs are connected in series to reduce an OFF current value. In this embodiment, the TFT 2402 has a double-gate structure; however, it may have a triple gate structure, or a multi-gate structure having more gates.

A current controlling TFT 2403 is formed by using the n-channel TFT 201 shown in FIG. 5B. At this time, a drain wiring 35 of the switching TFT 2402 is electrically connected to a gate electrode 37 of the current controlling TFT by a wiring 36. Furthermore, a wiring 38 is a gate wiring electrically connected to gate electrodes 39a and 39b of the switching TFT 2402.

At this time, it is very important that the current controlling TFT 2403 has a structure of the present invention. The current controlling TFT functions as an element for controlling the amount of a current flowing through an EL element, so that the current controlling TFT 2403 is likely to be degraded by heat and hot carriers due to a large amount of current flown therethrough. Therefore, an LDD region overlapping with a gate electrode, is provided on the current controlling TFT, thereby preventing the deterioration of TFT and enhancing the stability of the operation.

Furthermore, in this embodiment, the current controlling TFT 2403 has a single gate structure. However, it may have a multi-gate structure in which a plurality of TFTs are connected in series. Furthermore, it may also be possible that a plurality of TFTs are connected in parallel to substantially divide a channel formation region into a plurality of parts, so as to conduct highly efficient heat release. Such a structure is effective for preventing degradation due to heat.

As shown in FIG. 21A, a wiring to be the gate electrode 37 of the current controlling TFT 2403 overlaps a drain wiring 40 of the current controlling TFT 2403 via an insulating film in a region 2404. In the region 2404, a capacitor is formed. The capacitor 2404 functions for holding a voltage applied to a gate of the current controlling TFT 2403. The drain wiring 40 is connected to a current supply line (power source line) 2501 so as to be always supplied with a constant voltage.

A first passivation film 41 is provided on the switching TFT 2402 and the current controlling TFT 2403, and a flattening film 42 that is made of a resin insulating film is formed thereon. It is very important to flatten the step difference due to TFTs by using the flattening film 42. The step difference may cause a light-emitting defect because the EL layer to be formed later is very thin. Thus, it is desirable to flatten the step difference so that the EL layer is formed on a flat surface before forming a pixel electrode.

Reference numeral 43 denotes a pixel electrode (cathode of an EL element) that is made of a conductive film with high reflectivity and is electrically connected to the drain of the current controlling TFT 2403. As the pixel electrode 43, a low resistant conductive film such as an aluminum alloy film, a copper alloy film, and a silver alloy film, or a lamination film thereof can be preferably used. Needless to say, a lamination structure with other conductive films may also be used. A light-emitting layer 44 is formed in a groove (corresponding to a pixel) formed by banks 44a and 44b made of an insulating film (preferably resin). Herein, only one pixel is shown, however, light-emitting layers corresponding to each color R (red), G (green), and B (blue) may be formed. As an organic EL material for the light-emitting layer, a p-conjugate polymer material is used. Examples of the typical polymer material include polyparaphenylene vinylene (PPV), polyvinyl carbazole (PVK), and polyfluorene. There are various types of PPV organic EL materials. For example, materials as described in "H. Shenk, Becker, O. Gelsen, E. Kluge, W. Kreuder and H. Spreitzer, "Polymers for Light Emitting Diodes", Euro Display, Proceedings, 1999, pp. 33-37" and Japanese Laid-Open Publication No. 10-92576 can be used.

More specifically, as a light-emitting layer emitting red light, cyanopolyphenylene vinylene may be used. As a light-emitting layer emitting green light, polyphenylene vinylene may be used. As a light-emitting layer emitting blue light, polyphenylene vinylene or polyalkyl phenylene may be used. The film thickness may be prescribed to be 30 to 150 nm (preferably 40 to 100 nm). The above-mentioned organic EL materials are merely examples for use as a light-emitting layer, so that the present invention is not limited thereto. A light-emitting layer, an electric charge transporting layer, or an electric charge injection layer may be appropriately combined to form an EL layer (for light emitting and moving carriers therefore). For example, in this embodiment, the case where a polymer material is used for the light-emitting layer has been described. However, a low molecular-weight organic EL material may be used. Furthermore, an inorganic material such as silicon carbide can also be used for an electric charge transporting layer and an electric charge injection layer. As these organic EL materials and inorganic materials, known materials can be used.

In this embodiment, an EL layer with a lamination structure is used, in which a hole injection layer 46 made of PEDOT (polythiophene) or PAni (polyaniline) is provided on the light-emitting layer 45. An anode 47 made of a transparent conductive film is provided on the hole injection layer 46. In this embodiment, light generated by the light-emitting layer 45 is irradiated to the upper surface (toward the upper of TFTs), so that the anode must be transparent to light. As a transparent conductive film, a compound of indium oxide and tin oxide, and a compound of indium oxide and zinc oxide can be used. The conductive film is formed after forming the light-emitting layer and the hole injection layer with low heat resistance, so that the conductive film that can be formed at a possibly low temperature is preferably used.

When the anode 47 is formed, the EL element 2405 is completed. The EL element 2405 refers to a capacitor composed of the pixel electrode (cathode) 43, the light-emitting layer 45, the hole injection layer 46, and the anode 47. As show in FIG. 22A, the pixel electrode 43 substantially corresponds to the entire area of a pixel. Therefore, the entire pixel functions as an EL element. Thus, a light image display with very high light use efficiency can be performed.

In this embodiment, a second passivation film 48 is further formed on the anode 47. As the second passivation film 48, a silicon nitride film or a silicon nitride oxide film is preferably used. The purpose of the passivation film 48 is to prevent the EL element from being exposed to the outside. That is, the passivation film 48 protects an organic EL material from degradation due to oxidation, and suppresses the release of gas from the organic EL material. Because of this, the reliability of the EL display device is enhanced.

As described above, the EL display panel of the present invention has a pixel portion made of a pixel with a structure as shown in FIG. 21, and includes a switching TFT having a sufficiently low OFF current value and a current controlling TFT that is strong to the injection of hot carriers. Thus, an EL display panel having high reliability and is capable of displaying a satisfactory image, is obtained.

In this embodiment, referring to FIG. 20B, the case will be described where the structure of the EL layer is reversed. The current control TFT 2601 is formed using a p-channel type TFT 200 of FIG. 5B. The manufacturing process is referred to Embodiment 1. In this embodiment, a transparent conductive film is used as a pixel electrode (anode) 50. Specifically, a conductive film comprising a compound of indium oxide and zinc oxide. More specifically, a conductive film made of a compound of indium oxide and zinc oxide is used. Needless to say, a conductive film made of a compound of indium oxide and tin oxide may be used.

After banks 51a and 51b made of an insulating film are formed, a light-emitting layer 52 made of polyvinyl carbazole is formed by coating of a solution. On the light-emitting layer 52, an electron injection layer 53 made of potassium acetyl acetonate (acacK), and a cathode 54 made of an aluminum alloy are formed. In this case, the cathode 54 functions as a passivation film. Thus, an EL element 2602 is formed. In this embodiment, light generated by the light-emitting layer 53 is irradiated toward the substrate on which a TFT is formed as represented by an arrow. In the case of the structure of this embodiment, it is preferable that the current controlling TFT 2601 is formed of a p-channel TFT.

This embodiment can be realized by being appropriately combined with the structures of TFT in Embodiments 1 and 2. Furthermore, it is effective to use the EL display panel of this embodiment as a display portion of electronic equipment of Embodiment 9.

Embodiment 8

In this embodiment, referring to FIG. 22, the case will be described where a pixel having a structure different from that of the circuit diagram shown in FIG. 21B is used. Reference numeral 2701 denotes a source wiring of a switching TFT 2702, 2703 denotes a gate wiring of the switching TFT 2702, 2704 denotes a current controlling TFT, 2705 denotes a capacitor, 2706 and 2708 denote current supply lines, and 2707 denotes an EL element.

Figure 22A:
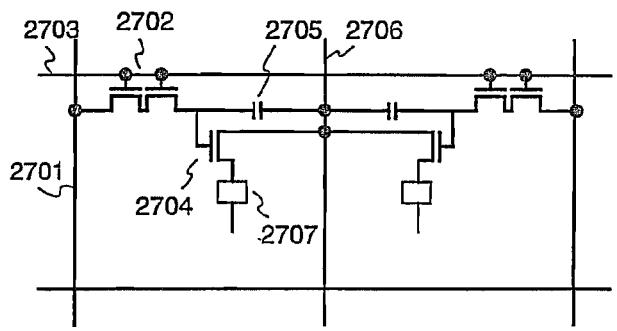
FIGS. 22A to 22C are examples of circuit diagrams of a pixel portion of an EL display device.

FIG. 22A shows the case where two pixels share the current supply line 2706. More specifically, two pixels are formed so as to be axisymmetric with respect to the current supply line 2706. In this case, the number of power supply lines can be reduced, so that the pixel portion is allowed to have a higher definition.

Figure 22B:
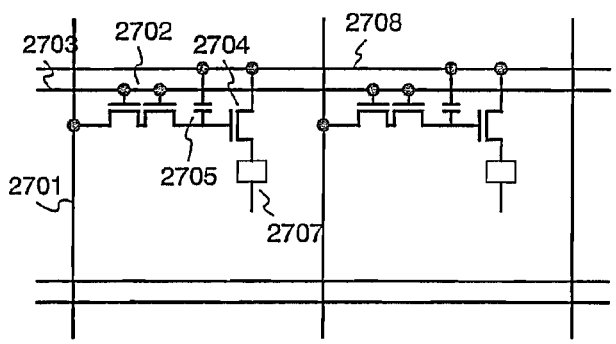

Furthermore, FIG. 22B shows the case where the current supply line 2708 and the gate wiring 2703 are provided in parallel. In FIG. 22B, although the current supply line 2708 does not overlap the gate wiring 2703, if both lines are formed on different layers, they can be provided so as to overlap each other via an insulating film. In this case, the current supply line 2708 and the gate wiring 2703 can share an occupied area, so that a pixel portion is allowed to have higher definition.

Figure 22C:
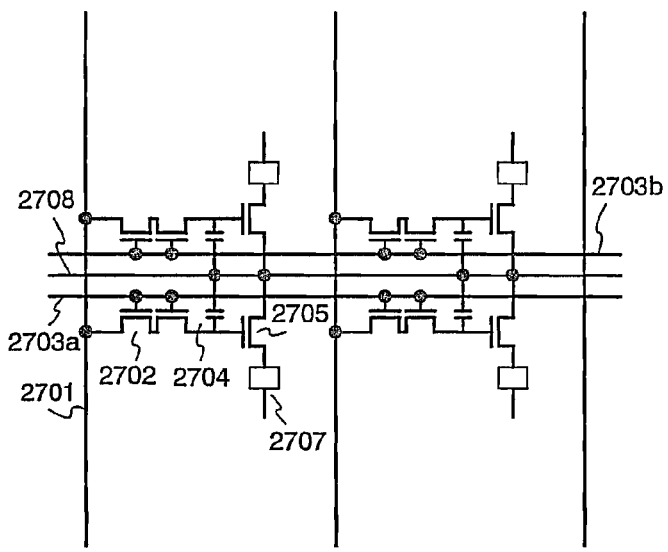

Furthermore, FIG. 22C shows the case where the current supply line 2708 and gate wiring 2703 are provided in parallel in the same way as in FIG. 22B, and two pixels are formed so as to be axisymmetric with respect to the current supply line 2708. It is also effective to provide the current supply line 2708 so as to overlap one of the gate wirings 2703. In this case, the number of the power supply lines can be reduced, so that a pixel portion is allowed to have higher definition. In FIGS. 22(A) and 22(B), the capacitor 2705 is provided so as to hold a voltage applied to a gate of the current controlling TFT 2704. However, the capacitor 2705 can be omitted.

Since the n-channel TFT according to the present invention as shown in FIG. 20A is used as the current controlling TFT 2704, the current controlling TFT 2704 has an LDD region provided so as to overlap a gate electrode via a gate insulating film. In this overlapping region, a parasitic capacitor called as a gate capacitor is generally formed. This embodiment is characterized in that the parasitic capacitor is actively used in place of the capacitor 2705. The capacitance of the parasitic capacitor is varied depending upon the area in which the above-mentioned gate electrode overlaps the LDD region. Therefore, the capacitance is determined by the length of the LDD region included in the region. Similarly, in the structure shown in FIGS. 22(A), 22(B), and 22(C), the capacitor 2705 can also be omitted.

This embodiment can be realized by being appropriately combined with the structures of TFT in Embodiments 1 and 2. Furthermore, it is effective to use an EL display panel of this embodiment as a display portion of electronic equipment of Embodiment 9.

Embodiment 9

In the present embodiment, a description will be given on a semiconductor device incorporating an active matrix liquid crystal display device made from a TFT circuit of the present invention, referring to FIGS. 23 to 25.

As such a semiconductor device, a portable information terminal (an electronic book, a mobile computer or a cellular phone), a video camera, a still-image camera, a personal computer, TV etc. may be enumerated. Examples of those are shown in FIGS. 23 and 24.

Figure 23A:
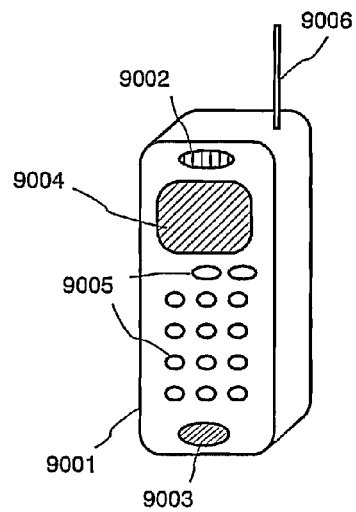
FIGS. 23A to 23F are diagrams showing examples of semiconductor devices.

FIG. 23A is a cellular phone, and it includes a main body 9001, a voice output section 9002, a voice input section 9003, a display device 9004, operation switches 9005, and an antenna 9006. The present invention can be applied to the voice output section 9002, the voice input section 9003 and the display device 9004 having an active matrix substrate.

Figure 23B:
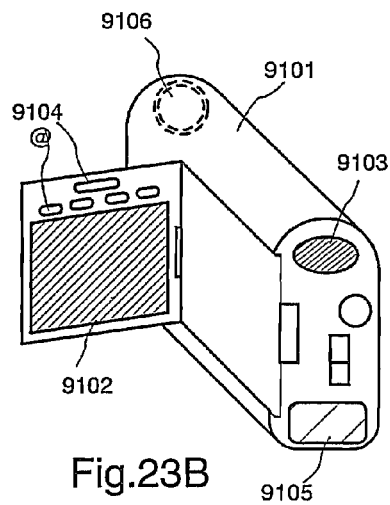

FIG. 23B shows a video camera, and it includes a main body 9101, a display device 9102, a voice input unit 9103, operation switches 9104, a battery 9105, and an image receiving unit 9106. The present invention is applicable to the voice input unit 9103, the display device 9102 having an active matrix substrate and the image receiving unit 9106.

Figure 23C:
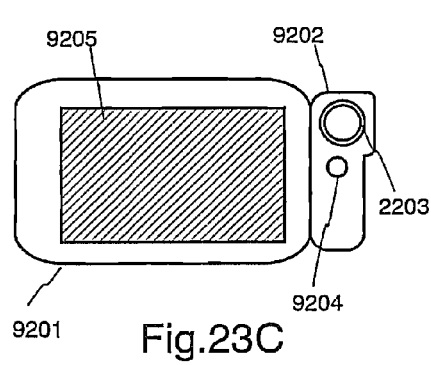

FIG. 23C shows a mobile computer or a portable information terminal, and it includes a main body 9201, a camera unit 9202, an image receiving unit 9203, operation switches 9204, and a display device 9205. The present invention can be applied to the image receiving unit 9203 and the display device 9205 having an active matrix substrate.

Figure 23D:
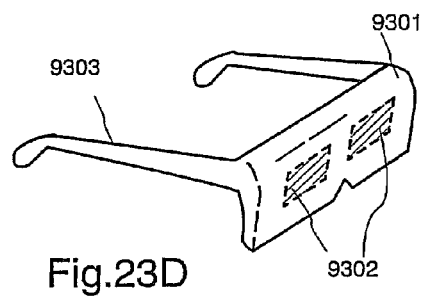

FIG. 23D shows a head mount display, and it includes a main body 9301, a display device 9302 and arm portions 9303. The present invention can be applied to the display device 9302. Further, although not shown, the present invention can also be used for other signal control circuits.

Figure 23E:
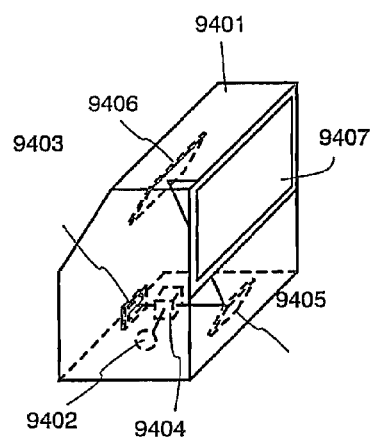

FIG. 23E shows a rear-type projector, and it includes a main body 9401, a light source 9402, display device 9403, a polarization beam splitter 9404, reflectors 9405 and 9406, and a screen 9407. The present invention can be applied to the display device 9403.

Figure 23F:
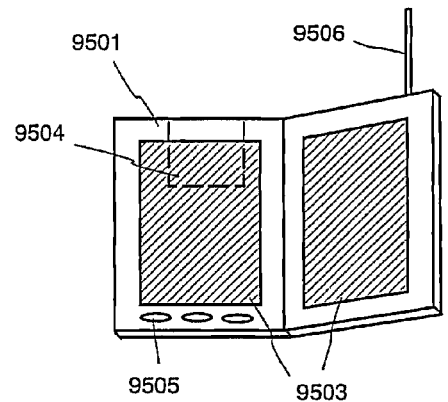

FIG. 23F shows a portable electronic book, and it includes a main body 9501, display devices 9502, 9503, a memory medium 9504, an operation switch 9505 and an antenna 9506. The book is used to display data stored in a mini-disk (MD) or a DVD, or a data received with the antenna. The display devices 9502, 9503 are direct-vision type display devices, to which the present invention may be applied.

Figure 24A:
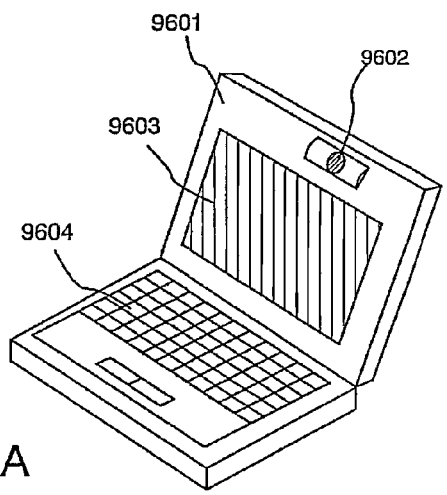
FIGS. 24A to 24C are diagrams showing examples of semiconductor devices.

FIG. 24A shows a personal computer comprising a main body 9601, an image inputting unit 9602, a display device 9603 and a key board 9604.

Figure 24B:
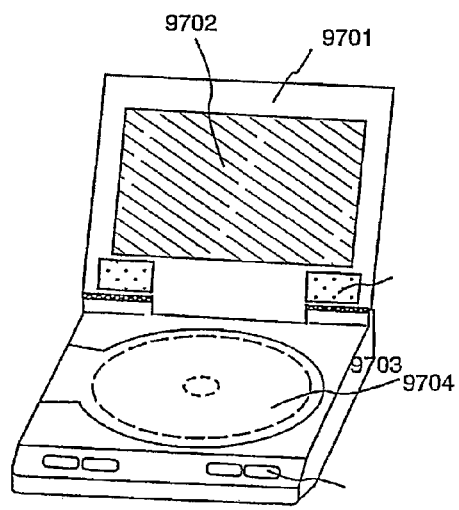

FIG. 24B shows a player that employs a recording medium in which programs are recorded (hereinafter referred to as a recording medium), and comprises a main body 9701, a display device 9702, a speaker unit 9703, a recording medium 9704, and an operation switch 9705. Incidentally, this player uses a DVD (Digital Versatile Disc), CD and the like as the recording medium to appreciate music and films, play games, and connect to the Internet.

Figure 24C:
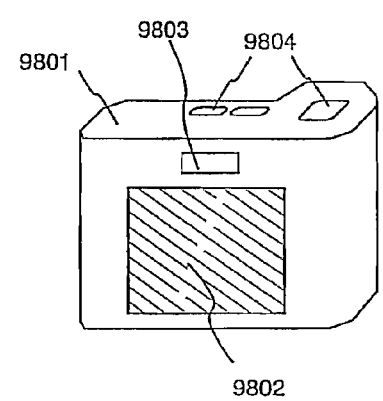

FIG. 24C shows a digital camera comprising a main body 9801, a display device 9802, an eye piece section 9803, operation switches 9804, and an image receiving unit (not shown).

Figure 25A:
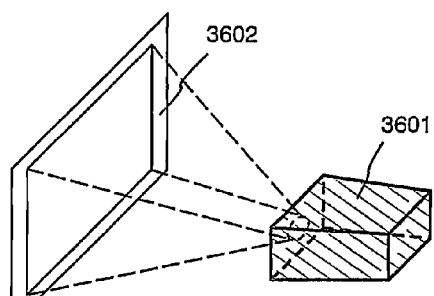
FIGS. 25A to 25D are diagrams showing a structure of a projecting type liquid crystal display device.

FIG. 25A shows a front-type projector comprising a display device 3601 and a screen 3602. The present invention is applicable to the display device and other signal control circuits.

Figure 25B:
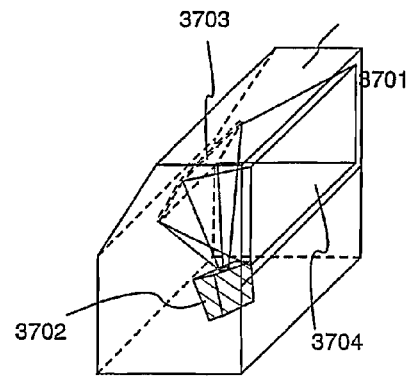

FIG. 25B shows a rear-type projector comprising a main body 3701, a projection device 3702, a mirror 3703, and a screen 3704. The present invention is applicable to the display device and other signal control circuits.

Figure 25C:
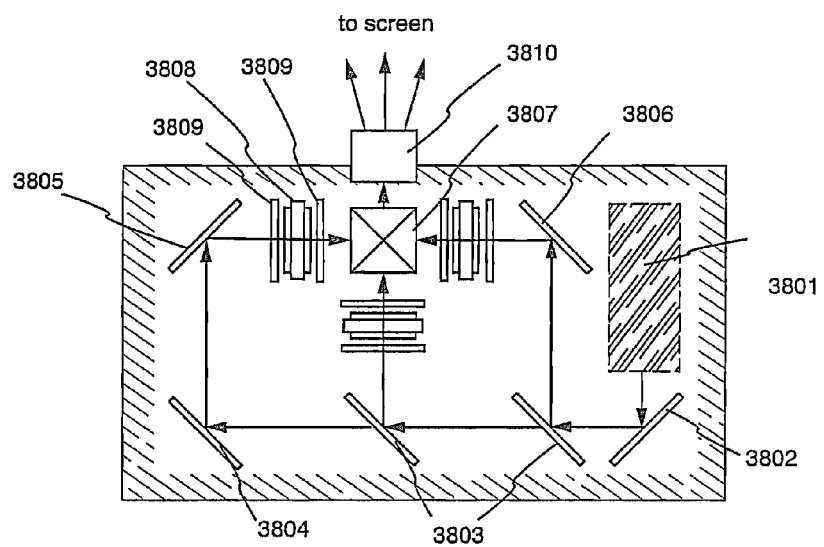

FIG. 25C is a diagram showing an example of the structure of the projection devices 3601, 3702 in FIGS. 25(A) and 25(B). The projection device 3601 or 3702 comprises a light source optical system 3801, mirrors 3802, 3804 to 3806, dichroic mirrors 3803, a prism 3807, liquid crystal display devices 3808, phase difference plates 3809, and a projection optical system 3810. The projection optical system 3810 is composed of an optical system including a projection lens. This example shows an example of Three plate type but not particularly limited thereto. For instance, the invention may be applied also to a Single plate type optical system. Further, in the light path indicated by an arrow in FIG. 25C, an optical system such as an optical lens, a film having a polarization function, a film for adjusting a phase difference, and an IR film may be suitably provided by a person who carries out the invention.

Figure 25D:
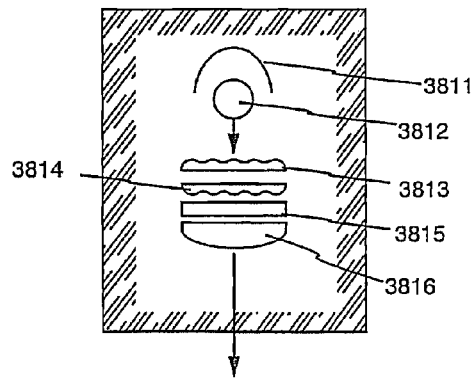

FIG. 25D is a diagram showing an example of the structure of the light source optical system 3801 in FIG. 25C. In this embodiment, the light source optical system 3801 comprises a reflector 3811, a light source 3812, lens arrays 3813, 3814, a polarization conversion element 3815, and a condenser lens 3816. The light source optical system shown in FIG. 25D is merely an example, and is not particularly limited to the illustrated structure. For example, a person who carries out the invention is allowed to suitably add to the light source optical system an optical system such as an optical lens, a film having a polarization function, a film for adjusting a phase difference, and an IR film.

Additionally, the present invention can be applied to image sensors and EL type display elements. As described above, the application range of the present invention is extremely broad, and the invention can be applied to electronic appliances of all fields.

Embodiment 10

The first etching process and the second etching process shown in embodiment 1 are targeted to a conducting film made from an element selected form the group consisting of W, Ta, Ti, and Mo, and an alloy of a combination of these elements. In particular, it is necessary to consider the etching speed of the object conducting film and the selectivity with respect to a base insulating film when etching. If the selectivity is small, it becomes difficult to perform selective machining with the result that a desired TFT cannot be formed.

Evaluation of the etching speed was performed using a test piece (sample) on which a W film or a silicon nitride oxide film is formed on a glass substrate. Resist that forms as a mask was formed with a thickness of 1500 nm, and the etching speed thereof was also evaluated. Etching was performed using an ICP etching apparatus, and a case of using a mixed gas of $CF_4$ and $Cl_2$ as an etching gas (condition 1), and a case of using a mixed gas of $CF_4$, $Cl_2$, and $O_2$ as a mixed gas (condition 2) were investigated. The results are shown in Table 1.
Table 1

Figure 26:
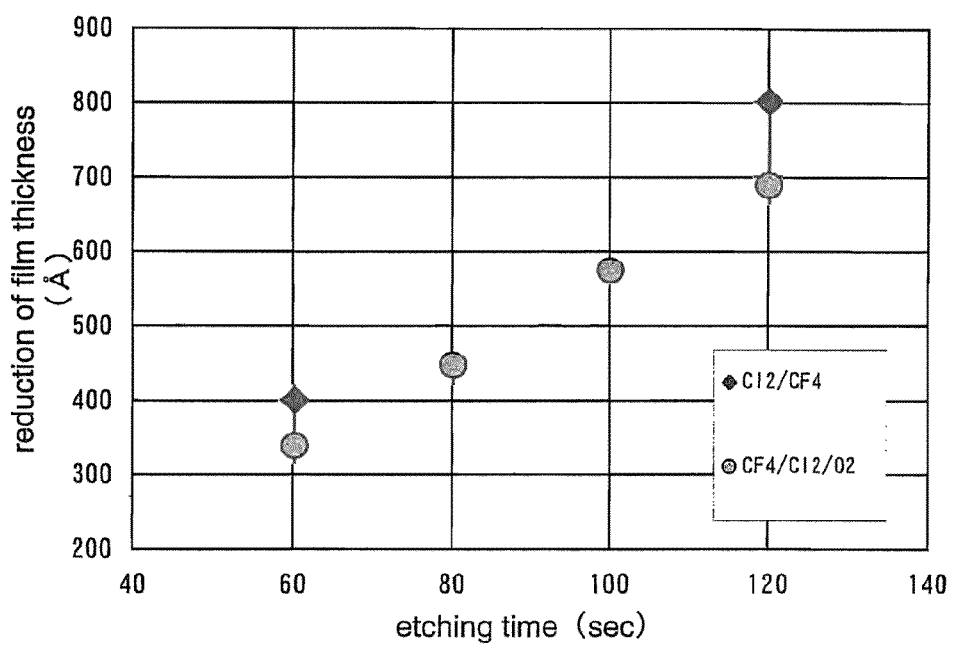
FIG. 26 is a graph showing a relation between the etching time and the decrease in the film thickness of silicon nitride oxide film.

Table 2 shows the amount of reduction in the film thickness of the silicon nitride oxide film with respect to etching time. As for etching, the above condition 1 and condition 2 were compared as in the above. The sample used was a glass substrate on which a 30 nm silicon film and a 200 nm silicon nitride oxide film were laminated. FIG. 26 similarly shows a graph of the amount of reduction in the film thickness with respect to etching time.
Table 2

From the results shown in Table 1 and Table 2, the etching speed of a W film is faster when $O_2$ is added to the etching gas, and the etching speed of the silicon nitride oxide film is reduced. In other words, it shows an increase in selectivity with the base film. The reason that the etching speed of the W film increases resides in that the amount of fluoride radicals increases due to the addition of $O_2$. Further, it is thought that the decrease in the etching speed of the silicon nitride oxide film is because carbon, a component of the resist film, bonds with oxygen, forming $CO_2$ due to the addition of $O_2$, and the amount of carbon is reduced.

Figure 27:
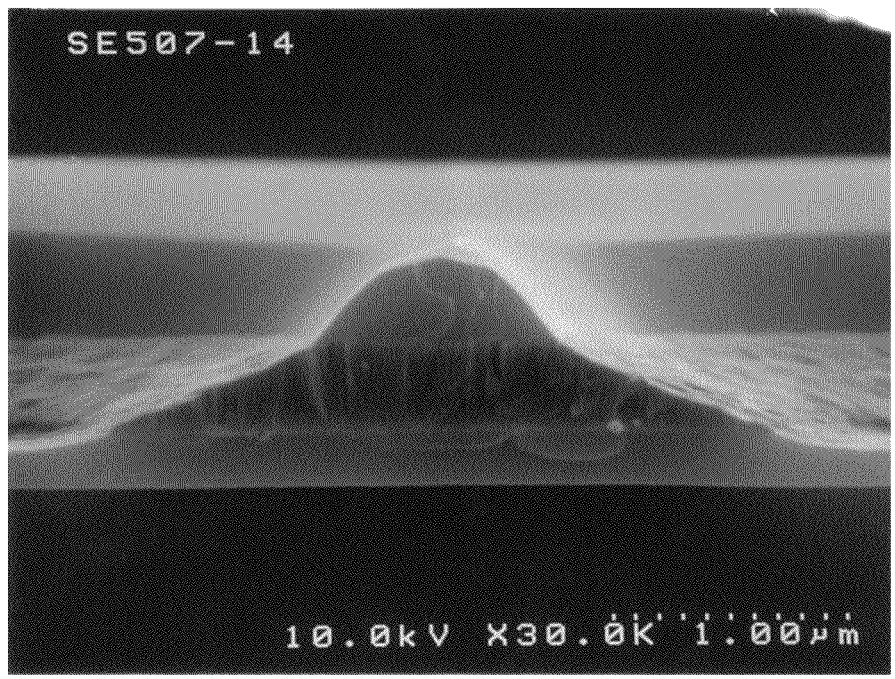
FIG. 27 is a cross sectional view of a tungsten film processed a first etching treatment which is obtained by SEM.

The shape of the conducting film processed by etching was observed by scanning electron microscopy (SEM). A 200 nm silicon nitride oxide film and a 400 nm W film were formed on a glass substrate as a test piece to be evaluated. The first etching process (taper etching) was performed with 30 SCCM of $Cl_2$ and 30 SCCM of $CF_4$ flowing as the etching gas, and applying an RF power of 3.2 W/cm² (13.56 Mhz) at a pressure of 1 Pa, and applying an RF power of 224 mW/cm² (13.56 Mhz) to the substrate side (test piece stage). The results observed by SEM of a cross section of the test piece obtained by performing etching at these conditions are shown in FIG. 27. The angle of a tapered portion formed on an edge portion of the W film is approximately 30 degrees.

Figure 28:
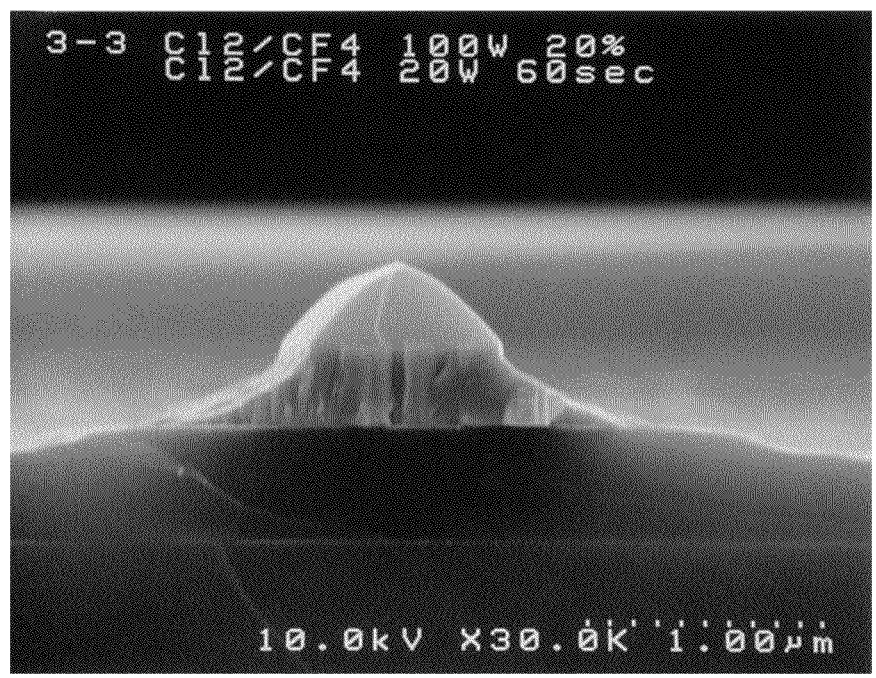
FIG. 28 is a cross sectional view of a tungsten film processed a second etching treatment using a mixture gas of $CF_4$ and $Cl_2$ which is obtained by SEM.
Figure 29:
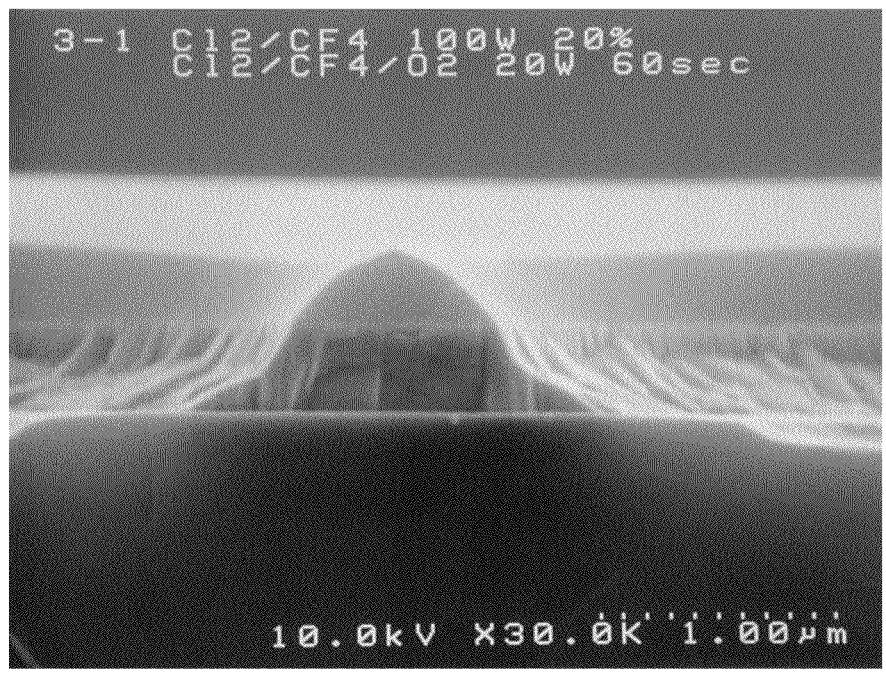
FIG. 29 is a cross sectional view of a tungsten film processed a second etching treatment using a mixture gas of CF4, Cl2 and O2.

Therefore, the second etching process (anisotropic etching) was performed in accordance with the above conditions 1 and 2, and comparatively evaluated therebetween. FIG. 28 shows the results of the test piece processed in accordance with condition 1, and FIG. 29 shows the results of the test piece processed in accordance with condition 2, both observed by SEM. The same shape was obtained for both FIG. 28 and FIG. 29. Note that the etching speed of the W film and the etching speed of the resist film increase in accordance with the addition of $O_2$ to the $CF_4$ and $Cl_2$ etching gas, and therefore the test piece formed by condition 2 shown in FIG. 29 becomes thinner. However, seen from the amount of reduction in the film thickness of the silicon nitride oxide film, condition 2 has less, and can be judged to be superior for selectively processing.

From the above experimental results, the mixed gas of $CF_4$, $Cl_2$, and $O_2$ can be employed as the etching gas in the first etching process and the second etching process. The determination of whether to perform tapered etching or anisotropic etching when selecting this type of etching gas can be made by controlling the bias power applied to the substrate side.

The design of an LDD in an actual TFT is estimated from the film thickness of the W film, the taper angle $\theta 1$ due to the first etching process, and the amount of resist etching due to the second etching process. For example, when the thickness of the W film is 400 nm in FIG. 2, and the angle $\theta 1$ of the tapered portion formed due to the first etching process is set as 30 degrees, then the length of the second impurity region (A) 1012 in the longitudinal direction of the channel becomes 700 nm. The amount of reduction of the resist due to the second etching process is 94 nm/min from Table 2, and considering this, it therefore can be estimated that an 825 nm LDD (Loff) is formed. In practice, there is a small amount of fluctuation in the film thickness and the etching speed, and therefore a small amount of increase or decrease will be present, but an approximately 1 μm LDD can be formed in accordance with this type of etching process.

FIG. 30 shows the characteristics of the gate voltage (Vg) vs. the drain current (Id) of a TFT manufactured employing the conditions of Table 2 as the first etching process and the conditions of Table 2 as the second etching process. The size of the TFT is a channel length of 7.5 μm, and a channel width of 8 μm, and an LDD (Loff) of 1 μm can be estimated. FIG. 3 shows the characteristics of an n-channel TFT, and in accordance with the LDD (Loff), an off current of 6.5 pA can be obtained when the gate voltage is −4.5 V and the drain voltage is 14 V.

It becomes possible to arrange TFTs having suitable functions in accordance with the specifications required by functional circuits in a semiconductor device having a plurality of functional circuits formed on the same substrate (specifically, an electro-optical device here), and the operating characteristics of the semiconductor device can be greatly increased, by using the present invention.

In accordance with a method of manufacturing a semiconductor device of the present invention, an active matrix substrate structured by a p-channel TFT and an n-channel TFT in a driver circuit portion, and with an LDD structure overlapping a portion of a gate electrode of a pixel TFT, can be manufactured by using 5 photomasks, and the concentration of a single conductivity type impurity element in an LDD region can be suitably set. A reflecting type liquid crystal display device can be manufactured using this type of active matrix substrate. Further, a transmitting type liquid crystal display device can be manufactured in accordance with the same processes by using 6 photomasks.

In accordance with a method of manufacturing a semiconductor device of the present invention, in a TFT having a gate electrode formed by a conductive material having heat resistance, and having a gate wiring formed by a low resistance conductive material, an active matrix substrate having a structure of a p-channel TFT and an n-channel TFT in a driver circuit portion, and an LDD structure overlapping a gate electrode of a pixel TFT can be manufactured by using 6 photomasks. A reflecting type liquid crystal display device can be manufactured using this type of active matrix substrate. Further, a transmitting type liquid crystal display device can be manufactured in accordance with the same processes by using 7 photomasks.

TABLE 1

| condition | ① W film etching speed nm/min | ② Silicon nitride oxide film etching speed nm/min | ③ resist film etching speed nm/min | selectivity ratio ①/② | ①/③ |
|---|---|---|---|---|---|
| CF₄/Cl₂ | 54.5 | 35.0 | 61.7 | 1.65 | 0.89 |
| CF₄/Cl₂/O₂ | 94.9 | 24.2 | 94.2 | 4.34 | 1.01 |

TABLE 2

| | condition | | | | amount of reduction in GI film thickness | | | |
|---|---|---|---|---|---|---|---|---|
| No. | ICP (W) | Bias (W) | gas | flow rate of gas (sccm) | etching time (sec) | AVERAGE (nm) | MAX (nm) | MIN (nm) | RANGE (nm) |
| ①-1 | 500 | 20 | CF4/Cl2 | 30/30 | 60 | 40.00 | 50.8 | 23.8 | 27.0 |
| ①-2 | 500 | 20 | CF4/Cl2 | 30/30 | 120 | 80.05 | 97.7 | 48.7 | 49.0 |
| ②-1 | 500 | 20 | CF4/Cl2/O2 | 25/25/10 | 60 | 33.79 | 42.7 | 18.5 | 24.2 |
| ②-2 | 500 | 20 | CF4/Cl2/O2 | 25/25/10 | 80 | 44.65 | 58.6 | 27.0 | 31.6 |
| ③-3 | 500 | 20 | CF4/Cl2/O2 | 25/25/10 | 100 | 57.32 | 73.0 | 31.6 | 41.4 |
| ③-4 | 500 | 20 | CF4/Cl2/O2 | 25/25/10 | 120 | 68.74 | 82.4 | 38.7 | 43.7 | pressure: 1 Pa (constant)

What is claimed is:

1. A semiconductor device comprising:
a first substrate;
a second substrate over the first substrate, the second substrate being smaller than the first substrate so that the first substrate has a first region which overlaps with the second substrate and a second region which does not overlap with the second substrate;
a pixel portion in the first region, the pixel portion comprising a plurality of pixels between the first substrate and the second substrate;
a wiring over the first substrate, the wiring extending from the first region to the second region;
a flexible printed circuit connected to the wiring in the second region, the flexible printed circuit being configured to transmit an electrical signal to the pixel portion; and
a sealant covering the flexible printed circuit, a part of the second region which does not overlap with the flexible printed circuit, and a side surface of the second substrate,
wherein the plurality of pixels each comprise:
a transistor; and
a light-emitting element over and electrically connected to the transistor, the light-emitting element comprising a white-emissive light-emitting layer which is configured to be coupled with a color filter so that the light-emitting element undergoes color display, and
where a space surrounded by the first substrate, the second substrate, and the sealant is filled with a filler to which a drying agent is mixed.

2. The semiconductor device according to claim 1, wherein the transistor comprises a gate electrode having a tapered side surface.

3. The semiconductor device according to claim 1,
wherein the transistor further comprises a first terminal and a second terminal and is configured to allow current to flow therebetween, and
wherein the light-emitting element is configured to emit light when the current flows therethrough.

4. The semiconductor device according to claim 3,
wherein the plurality of pixels each further comprise a second wiring configured to supply the current to the light-emitting element through the transistor, and
wherein the second wiring is shared by at least two pixels which neighbor each other.

5. The semiconductor device according to claim 1,
wherein the light-emitting element further comprises:
a first electrode and a second electrode which sandwich the white-emissive light-emitting layer; and
a passivation film over and in contact with the second electrode, and
wherein the filler is in contact with the passivation film.

6. The semiconductor device according to claim 1,
wherein the first substrate is a plastic substrate.

7. The semiconductor device according to claim 1,
wherein the semiconductor device is selected from a portable information terminal, a video camera, a still-image camera, a computer, and a television.

8. A semiconductor device comprising:
a first substrate;
a second substrate over the first substrate, the second substrate being smaller than the first substrate so that the first substrate has a first region which overlaps with the second substrate and a second region which does not overlap with the second substrate;
a pixel portion in the first region, the pixel portion comprising a plurality of pixels between the first substrate and the second substrate;
a wiring over the first substrate, the wiring extending from the first region to the second region;
a flexible printed circuit connected to the wiring in the second region, the flexible printed circuit being configured to transmit an electrical signal to the pixel portion;
a first sealant sandwiched between the first substrate and the second substrate and located in the first region; and
a second sealant in contact with the first sealant and located in the second region, the second sealant covering the flexible printed circuit, a part of the second region which does not overlap with the flexible printed circuit, a side surface of the second substrate, and a side surface of the first sealant,
wherein the plurality of pixels each comprise:
a transistor; and
a light-emitting element over and electrically connected to the transistor, the light-emitting element comprising a white-emissive light-emitting layer which is configured to be coupled with a color filter so that the light-emitting element undergoes color display, and
where a space surrounded by the first substrate, the second substrate, and the first sealant is filled with a filler to which a drying agent is mixed.

9. The semiconductor device according to claim 8,
wherein the transistor comprises a gate electrode having a tapered side surface.

10. The semiconductor device according to claim 8,
wherein the transistor further comprises a first terminal and a second terminal and is configured to allow current to flow therebetween, and
wherein the light-emitting element is configured to emit light when the current flows therethrough.

11. The semiconductor device according to claim 10,
wherein the plurality of pixels each further comprise a second wiring configured to supply the current to the light-emitting element through the transistor, and
wherein the second wiring is shared by at least two pixels which neighbor each other.

12. The semiconductor device according to claim 8,
wherein the light-emitting element further comprises:
a first electrode and a second electrode which sandwich the white-emissive light-emitting layer; and
a passivation film over and in contact with the second electrode, and
wherein the filler is in contact with the passivation film.

13. The semiconductor device according to claim 8,
wherein the first substrate is a plastic substrate.

14. The semiconductor device according to claim 8,
wherein the semiconductor device is selected from a portable information terminal, a video camera, a still-image camera, a computer, and a television.

15. A semiconductor device comprising:
a first substrate;
a second substrate over the first substrate, the second substrate being smaller than the first substrate so that the first substrate has a first region which overlaps with the second substrate and a second region which does not overlap with the second substrate;
a pixel portion in the first region, the pixel portion comprising a plurality of pixels between the first substrate and the second substrate;
a wiring over the first substrate, the wiring extending from the first region to the second region;
a flexible printed circuit connected to the wiring in the second region, the flexible printed circuit being configured to transmit an electrical signal to the pixel portion; and
a sealant covering a side surface of the second substrate, at least a part of the flexible printed circuit, and a part of the second region which does not overlap with the flexible printed circuit,
wherein the plurality of pixels each comprise:
a current control element comprising a plurality of transistors connected in parallel; and
a light-emitting element over and electrically connected to the current control element,
wherein the light-emitting element comprises:
a transparent anode electrically connected to the current control element;
a white-emissive light-emitting layer over the transparent anode; and
a cathode over the white-emissive light-emitting layer, and
where a space surrounded by the first substrate, the second substrate, and the sealant is filled with a filler to which a drying agent is mixed.

16. The semiconductor device according to claim 15,
wherein the current control element comprises a gate electrode having a tapered side surface.

17. The semiconductor device according to claim 15,
wherein the current control element is configured to allow current to flow therein, and
wherein the light-emitting element is configured to emit light when the current flows therethrough.

18. The semiconductor device according to claim 17,
wherein the plurality of pixels each further comprise a second wiring configured to supply the current to the light-emitting element through the current control element, and
wherein the second wiring is shared by at least two pixels which neighbor each other.

19. The semiconductor device according to claim 15,
wherein the first substrate is a plastic substrate.

20. The semiconductor device according to claim 15,
wherein the white-emissive light-emitting layer is configured to be coupled with a color filter so that the light-emitting element undergoes color display.

21. The semiconductor device according to claim 15,
wherein the semiconductor device is selected from a portable information terminal, a video camera, a still-image camera, a computer, and a television.

* * * * *